US010283538B2

(12) United States Patent
Kajimura et al.

(10) Patent No.: US 10,283,538 B2
(45) Date of Patent: May 7, 2019

(54) IMAGING DEVICE AND METHOD OF DRIVING IMAGING DEVICE

(71) Applicant: CANON KABUSHIKI KAISHA, Tokyo (JP)

(72) Inventors: Fumihiro Kajimura, Kawasaki (JP); Yasuo Suda, Yokohama (JP); Koichi Washisu, Tokyo (JP); Akihiko Nagano, Ichihara (JP); Ryo Yamasaki, Tokyo (JP); Masafumi Kimura, Kawasaki (JP); Makoto Oikawa, Yokohama (JP); Go Naito, Kawasaki (JP)

(73) Assignee: CANON KABSHIKI KAISHA, Tokyo (JP)

( * ) Notice: Subject to any disclaimer, the term of this patent is extended or adjusted under 35 U.S.C. 154(b) by 88 days.

(21) Appl. No.: 15/432,288

(22) Filed: Feb. 14, 2017

(65) Prior Publication Data

US 2017/0237927 A1 Aug. 17, 2017

(30) Foreign Application Priority Data

Feb. 17, 2016 (JP) ................................. 2016-027556
Dec. 16, 2016 (JP) ................................. 2016-244551

(51) Int. Cl.
*H01L 27/00* (2006.01)
*H01L 27/146* (2006.01)
(Continued)

(52) U.S. Cl.
CPC ... *H01L 27/14612* (2013.01); *H04N 5/35563* (2013.01); *H04N 5/378* (2013.01); *H04N 5/37457* (2013.01); *H04N 9/045* (2013.01)

(58) Field of Classification Search
CPC .... H04N 5/374; H04N 5/3742; H04N 5/3745; H04N 5/378
(Continued)

(56) References Cited

U.S. PATENT DOCUMENTS 5,583,076 A 12/1996 Yoshizawa et al.
5,912,504 A 6/1999 Yoshizawa et al.
(Continued)

FOREIGN PATENT DOCUMENTS

JP 2013-172210 9/2013
JP 2014-48459 3/2014

*Primary Examiner* — Kevin K Pyo
(74) *Attorney, Agent, or Firm* — Venable LLP

(57) ABSTRACT

An imaging device includes a plurality of pixels, each of which including a first pixel element including a first photoelectric conversion unit, and a second pixel element including a second photoelectric conversion unit lower in sensitivity than the first photoelectric conversion unit, a readout circuit configured to read out a first image signal based on signal charge generated in the first pixel element during a first accumulation period, and a second image signal based on signal charge generated in the second pixel element during a second accumulation period longer than the first accumulation period, the second image signal being synchronized with the first image signal, and a control unit configured to control the readout circuit so that a first readout period for reading out the first image signal is performed during the second accumulation period.

20 Claims, 28 Drawing Sheets

(51) Int. Cl.
*H04N 5/355* (2011.01)
*H04N 5/3745* (2011.01)
*H04N 5/378* (2011.01)
*H04N 9/04* (2006.01)

(58) Field of Classification Search
USPC ............... 250/208.1; 348/297, 303, 320
See application file for complete search history.

(56) References Cited

U.S. PATENT DOCUMENTS

| | | |
|---|---|---|
| 7,060,961 B2 | 6/2006 | Dobashi et al. |
| 7,245,324 B2 | 7/2007 | Namazue et al. |
| 7,652,713 B2 | 12/2010 | Yamasaki |
| 8,681,261 B2 | 3/2014 | Oikawa |
| 8,754,976 B2 | 6/2014 | Oikawa |
| 8,913,175 B2 | 12/2014 | Nagano et al. |
| 9,224,771 B2 | 12/2015 | Yamashita |
| 9,451,216 B2 | 9/2016 | Nobayashi |
| 2009/0213237 A1* | 8/2009 | Ishida .................... H04N 5/232 348/221.1 |
| 2013/0038757 A1* | 2/2013 | Haneda .............. H04N 5/23212 348/231.99 |
| 2016/0086988 A1 | 3/2016 | Yamashita |
| 2017/0236552 A1* | 8/2017 | Kimura ................ G11B 27/105 386/216 |

\* cited by examiner

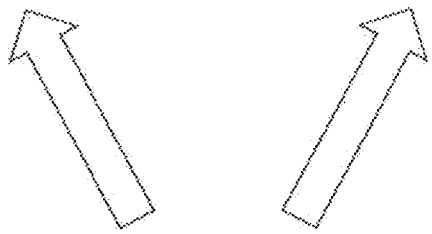

APERTURE  SHUTTER SPEED
F4.0      1/1000

APERTURE  SHUTTER SPEED
F4.0      1/60

IMAGING DEVICE AND METHOD OF DRIVING IMAGING DEVICE

BACKGROUND OF THE INVENTION

Field of the Invention

The present invention relates to an imaging device and a method of driving an imaging device.

Description of the Related Art

If a moving image and a still image can be shot at the same time with one camera, not only can a shooting scene be viewed as a moving image, but also a decisive scene in the moving image can be seen as a still image for fun. This can significantly enhance the values of shot images. Further, if a moving image at a normal frame rate and a moving image at a high frame rate can be shot at the same time with one camera, a specific scene can be switched to a slow-motion moving image to enjoy the image as a high-definition moving image. This can give a viewer an uplifting feeling.

Further, as a technique for making a movie or a TV image more realistic, there is an HDR (High Dynamic Range) technique for the moving image. This is to synthesize outputs from two pixel groups different in sensitivity to expand the reproduction range of luminance on a display screen in order to make the movie or the TV image realistic more than that in the conventional mainly by increasing instantaneous or partial luminance.

As an imaging device used to shoot such an image, there is proposed an imaging device using an imaging element having pixels including a plurality of photoelectric conversion units different in light-receiving efficiency. Japanese Patent Application Laid-Open No. 2014-048459 discloses an imaging device with a pair of photodiodes having asymmetric pupil shapes provided in each pixel. In the imaging device described in Japanese Patent Application Laid-Open No. 2014-048459, one of the pair of photodiodes is high in light-receiving efficiency and the other photodiode is low in light-receiving efficiency. Two signals from the pair of photodiodes are used as different image data to enable simultaneous shooting of two images.

However, in the imaging device that performs simultaneous shooting of two images, it is necessary to read out a plurality of images based on signals different in accumulation time within one frame period. If it takes time to read out these signals, the time required for one frame period will be long, resulting in a decrease in frame rate.

SUMMARY OF THE INVENTION

It is an object of the present invention to provide an imaging device and a method of driving an imaging device, capable of easy readout of a plurality of images based on signals different in accumulation period without sacrificing the frame rate.

According to one aspect of the present invention, there is provided an imaging device including a plurality of pixels, each of the plurality of pixels including a first pixel element including a first photoelectric conversion unit, and a second pixel element including a second photoelectric conversion unit lower in sensitivity than the first photoelectric conversion unit, a readout circuit configured to read out, from the plurality of pixels, a first image signal based on signal charge generated in the first pixel element of each of the plurality of pixels during a first accumulation period, and a second image signal based on signal charge generated in the second pixel element of each of the plurality of pixels during a second accumulation period longer than the first accumulation period, the second image signal being synchronized with the first image signal, and a control unit configured to control the readout circuit so that a first readout period for reading out the first image signal is performed during the second accumulation period.

According to another aspect of the present invention, there is provided an imaging device including a plurality of pixels, each of the plurality of pixels including a photoelectric conversion unit, and first and second signal holding units, a readout circuit configured to read out, from the plurality of pixels, a first image signal generated by transferring, at least once to the first signal holding unit, signal charge generated in the photoelectric conversion unit in one shooting cycle, and a second image signal generated by transferring, at least twice or more to the second signal holding unit, and adding up signal charge generated in the photoelectric conversion unit in the one shooting cycle, the second image signal being synchronized with the first image signal, and a control unit configured to control the readout circuit so that a readout period of reading out the first image signal is performed during the accumulation period of the second image signal.

According to still another aspect of the present invention, there is provided a method of driving an imaging device including an imaging element having a plurality of pixels, each of the plurality of pixels including a photoelectric conversion unit, and first and second signal holding units, the method including reading out, from the plurality of pixels, a first image signal generated by transferring, at least once to the first signal holding unit, signal charge generated in the photoelectric conversion unit in one shooting cycle, and reading out, from the plurality of pixels, a second image signal generated by transferring, at least twice or more to the second signal holding unit, and adding up signal charge generated in the photoelectric conversion unit in the one shooting cycle, the second image signal being synchronized with the first image signal, wherein the reading out the first image signal is performed during an accumulation period of the second image signal.

Further features of the present invention will become apparent from the following description of exemplary embodiments with reference to the attached drawings.

BRIEF DESCRIPTION OF THE DRAWINGS

FIG. 7A, FIG. 7B, and FIG. 7C are schematic diagrams for describing image signals output from the imaging element.

DESCRIPTION OF THE EMBODIMENTS

[First Embodiment]

An imaging device according to a first embodiment of the present invention will be described with reference to FIG. 1A to FIG. 27. In the present embodiment, description will be made by taking, as an example of a preferred embodiment of the present invention, an imaging device including an imaging optical system and an imaging element for imaging, and an image processing device that processes an image signal output from the imaging element. Note that the image processing device is not necessarily required to be part of the imaging device, and it may be configured in hardware different from that of the imaging element and the imaging optical system. Further, the whole or part of the functionality of the image processing device may be included in the imaging element.

Figure 1A:
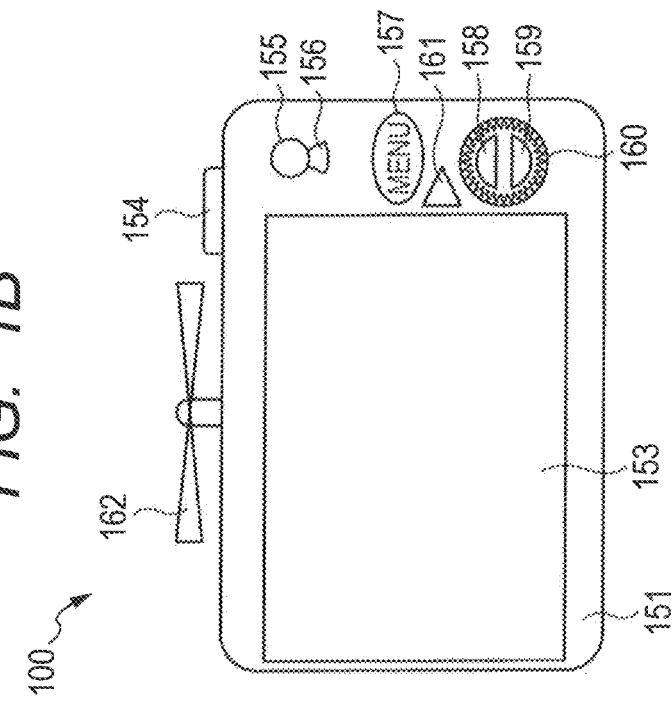
FIG. 1A and FIG. 1B are external views of an imaging device according to a first embodiment of the present invention.
Figure 1B:
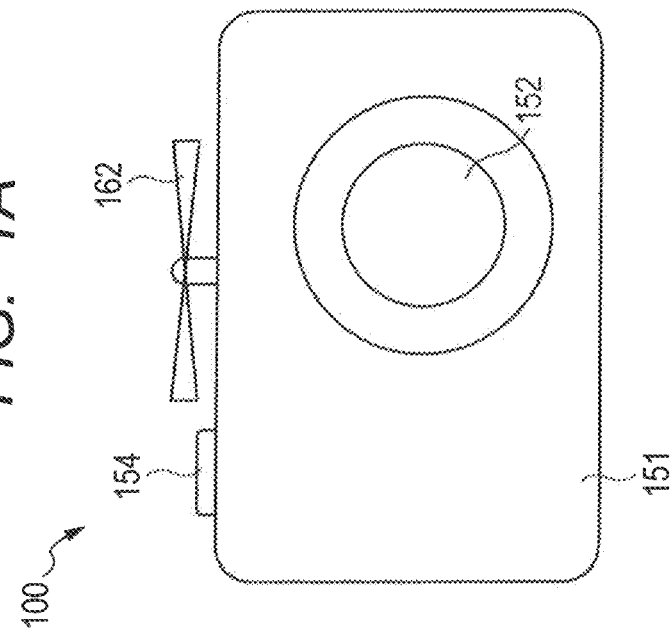

FIG. 1A and FIG. 1B are external views of a digital still motion camera as an example of the imaging device according to the present embodiment. FIG. 1A illustrates a front view and FIG. 1B illustrates a back view.

An imaging device 100 according to the present embodiment includes a housing 151, an imaging optical system 152 provided in a front portion of the housing 151, and a switch ST 154 and a propeller 162 provided on the top face of the housing 151. The imaging device 100 also includes, on the back side of the housing 151, a display unit 153, a switch MV 155, a shooting mode selecting lever 156, a menu button 157, up and down switches 158, 159, a dial 160, and a playback button 161.

The housing 151 is a case for housing various functional parts, such as the imaging element, a shutter, and the like, which constitute the imaging device 100. The imaging optical system 152 is an optical system for forming an optical image of an object. The display unit 153 is configured to include a display for displaying photographic information and an image. A movable mechanism may be provided in the display unit 153 to angle a screen as necessary. The display unit 153 has a display brightness range capable of displaying an image having a wide dynamic range without suppressing the brightness range of the image. The switch ST 154 is a shutter button mainly used to shoot a still image. The switch MV 155 is a button used to start or stop moving image shooting. The shooting mode selecting lever 156 is a selector switch for selecting a shooting mode. The menu button 157 is a button to move to a function setting mode for setting the function of the imaging device 100. The up and down switches 158, 159 are buttons used to change various set values. The dial 160 is a dial for changing various set values. The playback button 161 is a button to move to a playback mode for playbacking, on the display unit 153, an image recorded on a recording medium housed in the imaging device 100. The propeller 162 is to make the imaging device 100 float in the air in order to take images from the air.

Figure 2:
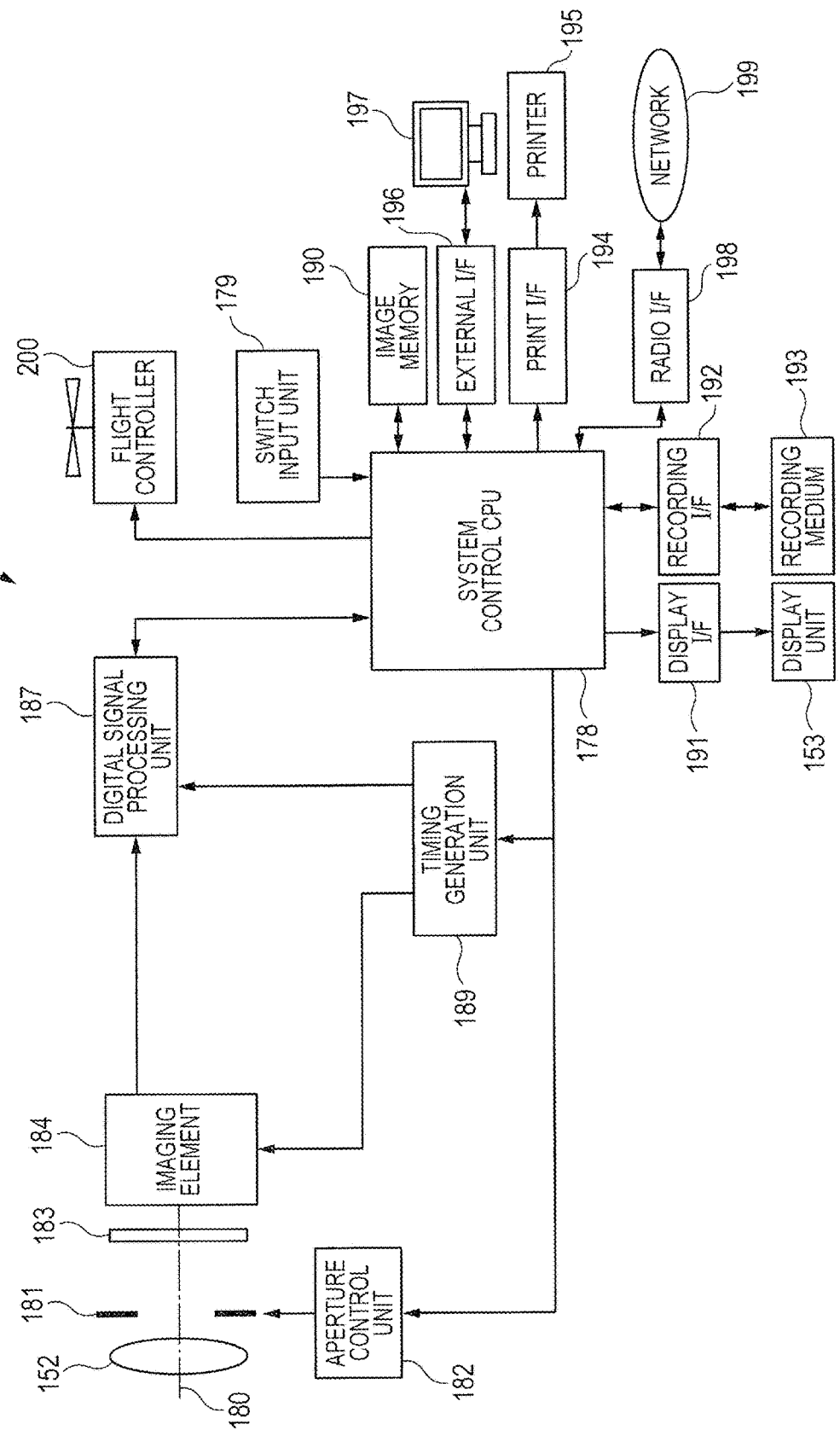
FIG. 2 is a block diagram illustrating a schematic configuration of the imaging device according to the first embodiment of the present invention.

FIG. 2 is a block diagram illustrating a schematic configuration of the imaging device according to the present embodiment. As illustrated in FIG. 2, the imaging device 100 includes an aperture 181, an aperture control unit 182, an optical filter 183, an imaging element 184, a digital signal processing unit 187, and a timing generation unit 189. The imaging device 100 also includes a system control CPU 178, a switch input unit 179, an image memory 190, and a flight controller 200. Further, the imaging device 100 includes a display interface unit 191, a recording interface unit 192, a recording medium 193, a print interface unit 194, an external interface unit 196, and a radio interface unit 198.

The imaging element 184 is to convert an optical image of an object formed through the imaging optical system 152 into an electrical image signal. Though not particularly limited, the imaging element 184 has, for example, the number of pixels, the signal readout rate, the color gamut, and the dynamic range enough to meet a standard such as the UHDTV (Ultra High Definition Television) standard. The aperture 181 is to adjust the amount of light passing through the imaging optical system 152. The aperture control unit 182 is a circuit or a processor configured to control the aperture 181. The optical filter 183 is to limit the wavelength band of light incident on the imaging element 184 and the spatial frequency to be transmitted to the imaging element 184.

The digital signal processing unit 187 is to compress image data after processing various corrections to digital image data output from the imaging element 184. The corrections processed by the digital signal processing unit 187 include crosstalk correction to be described later. The timing generation unit 189 is a circuit or a processor configured to output various timing signals to the imaging element 184 and the digital signal processing unit 187. The system control CPU 178 is a control unit for carrying out various operations and performing overall control of the imaging device 100 together with the timing generation unit 189.

The image memory 190 is to temporarily store image data. The display interface unit (display I/F) 191 is an interface between the system control CPU 178 and the display unit 153 to display a shot image in the display unit 153 such as a liquid crystal display. The recording medium 193 is a recording medium such as a semiconductor memory to record image data, additional data, and the like, which may be equipped in the imaging device 100 or be removable. The recording interface unit (recording I/F) 192 is an interface between the system control CPU 178 and the recording medium 193 to perform recording on the recording medium 193 or reading out from the recording medium. The external interface unit (external I/F) 196 is an interface between the system control CPU 178 and an external device to communicate with the external device such as an external computer 197. The print interface unit (print I/F) 194 is an interface between the system control CPU 178 and a printer 195 to output a shot image to the printer 195 such as a small ink-jet printer in order to print out the shot image. The radio interface unit (radio I/F) 198 is an interface between the system control CPU 178 and a network 199 such as the Internet to communicate with the network 199. The switch input unit 179 includes plural switches to switch various modes, such as the switch ST 154 and the switch MV 155. The flight controller 200 is a controller to control the propeller 162 so as to fly the imaging device 100 in order to do shooting from the air.

Figure 3:
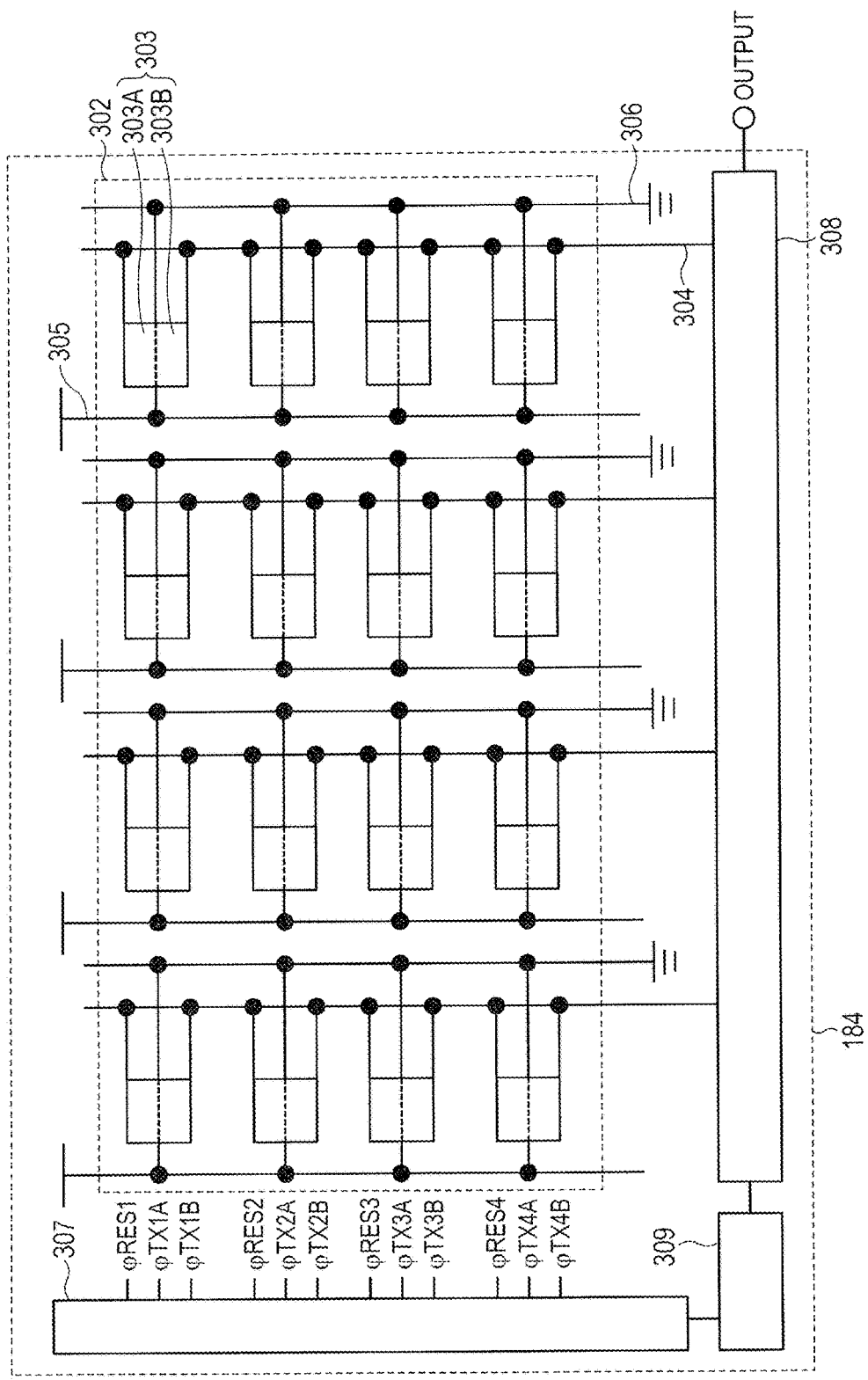
FIG. 3 is a block diagram illustrating a configuration example of an imaging element of the imaging device according to the first embodiment of the present invention.

FIG. 3 is a block diagram illustrating a configuration example of the imaging element 184. As illustrated in FIG. 3, the imaging element 184 includes a pixel array 302, a vertical scanning circuit 307, a readout circuit 308, and a timing control circuit 309.

In the pixel array 302, a plurality of pixels 303 are arranged in the shape of a matrix. Although the actual number of pixels 303 belonging to the pixel array 302 is generally enormous, only 16 pixels 303 arranged in a 4×4 matrix are illustrated here for the sake of simplifying the figure. Each of the plurality of pixels 303 includes a pair of a pixel element 303A and a pixel element 303B. In FIG. 3, the upper half area of the pixel 303 is the pixel element 303A, and the lower half area of the pixel 303 is the pixel element 303B. The pixel element 303A and the pixel element 303B generate signals by photoelectric conversion, respectively.

A signal output line 304 extending in the column direction is provided in each column of the pixel array 302, respectively. The signal output line 304 in each column is connected to the pixel elements 303A and pixel elements 303B belonging to the column. Signals from the pixel elements 303A, and signals from the pixel element 303B are output to the signal output line 304. Further, in each column of the pixel array 302, a power source line 305 and a ground line 306 extending in the column direction are provided, respectively. The power source line 305 and the ground line 306 in each column are connected to the pixels 303 belonging to the column. The power source line 305 and the ground line 306 may be signal lines extending in the row direction.

The vertical scanning circuit 307 is arranged adjacent to the pixel array 302 in the row direction. The vertical scanning circuit 307 outputs predetermined control signals to the plurality of pixels 303 of the pixel array 302 in units of rows through unillustrated control lines arranged to extend in the row direction in order to control readout circuits in the pixels 303. In FIG. 3, a reset pulse φRESn and transfer pulses φTXnA, φTXnB are illustrated as control signals (where n is an integer corresponding to each row number).

The readout circuit 308 is arranged adjacent to the pixel array 302 in the column direction. The readout circuit 308 is connected to the signal output line 304 in each column. The readout circuit 308 selectively activates the signal output line 304 in each column sequentially to read signals from the signal output line 304 in each column in a sequential order and perform predetermined signal processing. The readout circuit 308 can include a noise cancellation circuit, an amplifier circuit, an analog/digital converter circuit, and a horizontal scanning circuit, respectively, to output signals after being subjected to the predetermined signal processing sequentially.

The timing control circuit 309 is connected to the vertical scanning circuit 307 and the readout circuit 308. The timing control circuit 309 outputs a control signal to control the drive timing of the vertical scanning circuit 307 and the readout circuit 308.

Figure 4:
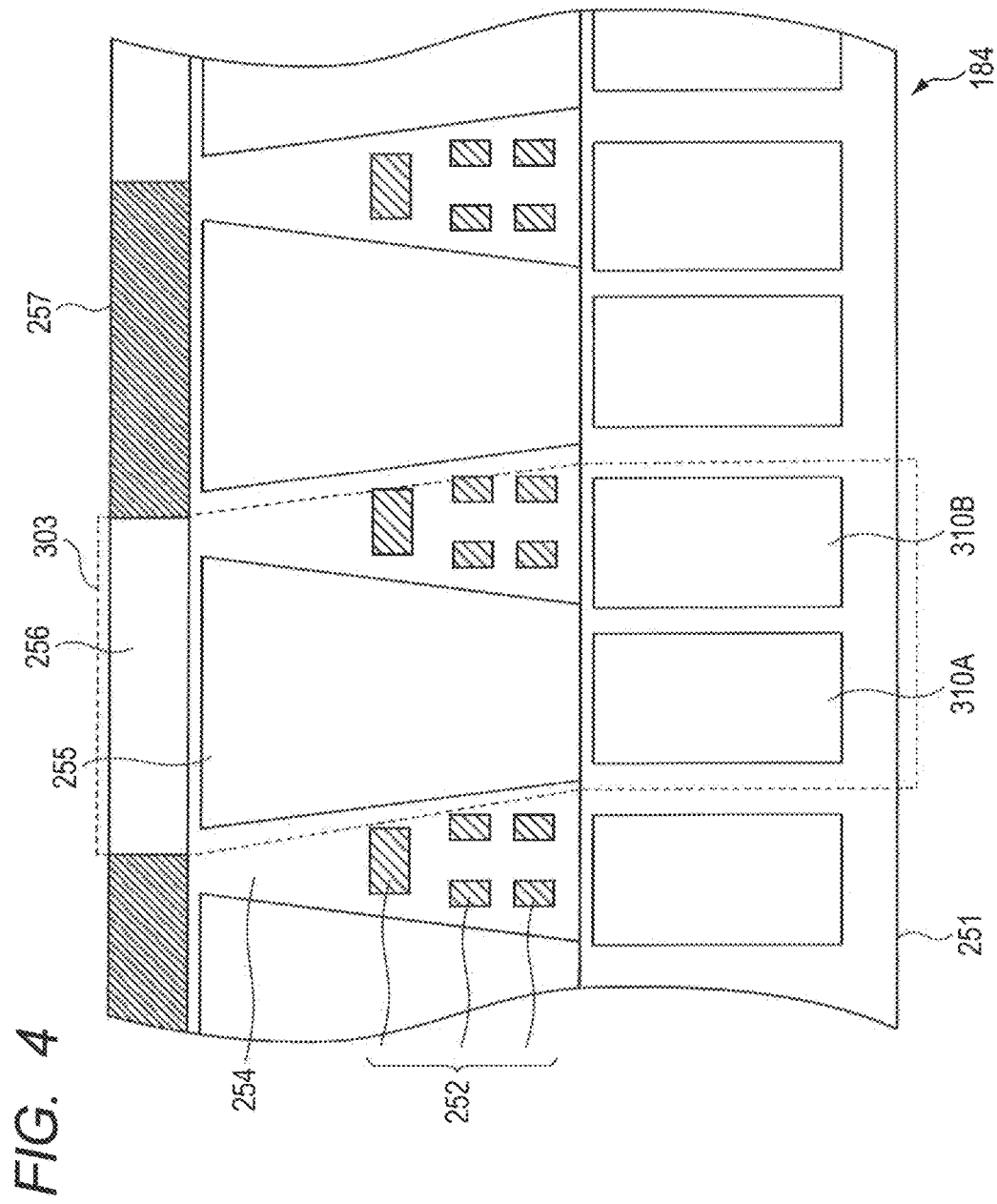
FIG. 4 is a cross-sectional view illustrating the internal structure of the imaging element of the imaging device according to the first embodiment of the present invention.

FIG. 4 is a cross-sectional view illustrating the internal structure of each pixel 303 of the imaging element 184. As illustrated in FIG. 4, each pixel 303 includes two photodiodes 310A, 310B, a light guide 255, and a color filter 256. The photodiode 310A forms part of the pixel element 303A and the photodiode 310B forms part of the pixel element 303B. The photodiodes 310A, 310B are provided in a silicon substrate 251. The light guide 255 is provided in an insulating layer 254 provided over the silicon substrate 251. The insulating layer 254 is, for example, made of silicon oxide, and the light guide 255 is made of a material having a higher refractive index than the insulating layer 254 such as silicon nitride. Interconnection layers 252 are provided in the insulating layer 254 between adjacent light guides 255. The color filter 256 having predetermined spectral transmittance characteristics is provided over the light guide 255. Note that FIG. 4 illustrates an example in which color filters of adjacent two pixels 303 are color filters 256, 257 having spectral transmittance characteristics different from each other.

The light guide 255 has the property of confining light therein due to a refractive index difference from the insulating layer 254. This enables the light guide 255 to guide light incident through the color filter 256 to the photodiodes 310A, 310B. The photodiodes 310A, 310B are arranged asymmetric with respect to the light guide 255, and a light flux propagating through the light guide 255 enters the photodiode 310A with relatively high efficiency and enters the photodiode 310B with relatively low efficiency. Further, the depth and inclined angle of the light guide 255 can be adjusted to prevent nonuniformity in the incident angle characteristics of incident light flux capable of being converted photoelectrically by the photodiodes 310A, 310B effectively.

Figure 5:
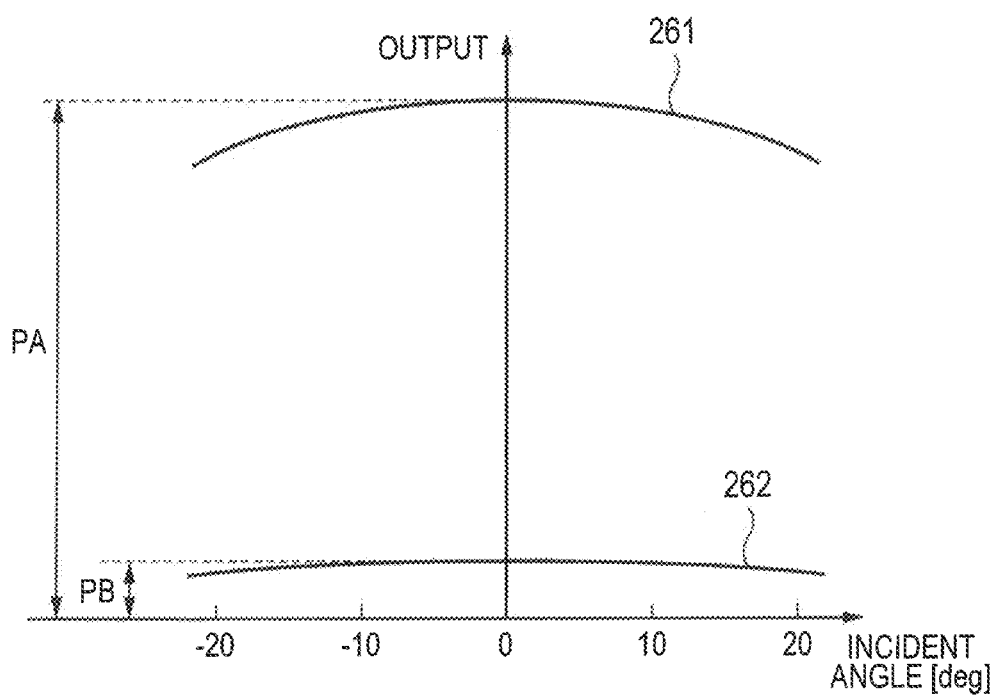
FIG. 5 is a graph illustrating a relationship between the angle of a light beam incident on a pixel and output from photodiodes.

FIG. 5 is a graph illustrating a relationship between the angle of a light beam incident on a pixel and output from photodiodes. In FIG. 5, the abscissa represents the angle of the light beam incident on the pixel, and the ordinate represents output from the photodiodes. In FIG. 5, an output characteristic 261 from the photodiode 310A and an output characteristic 262 from the photodiode 310B are illustrated.

As illustrated in FIG. 5, the characteristic 261 and the characteristic 262 both exhibit gentle hill-like shapes symmetric about peaks, each of which the incident angle of the light beam is zero. The peak intensity PB of the characteristic 262 is about ⅛ of the peak intensity PA of the characteristic 261. This means that the dependences of the photodiodes 310A, 310B on the incident angle are both small and the light-receiving efficiency of the photodiode 310B is ⅛ of that of the photodiode 310A. In other words, when the sensitivity of the photodiode 310B is replaced by a set value of the ISO sensitivity, the sensitivity of the photodiode 310B becomes lower by three steps than that of the photodiode 310A.

Figure 6B:
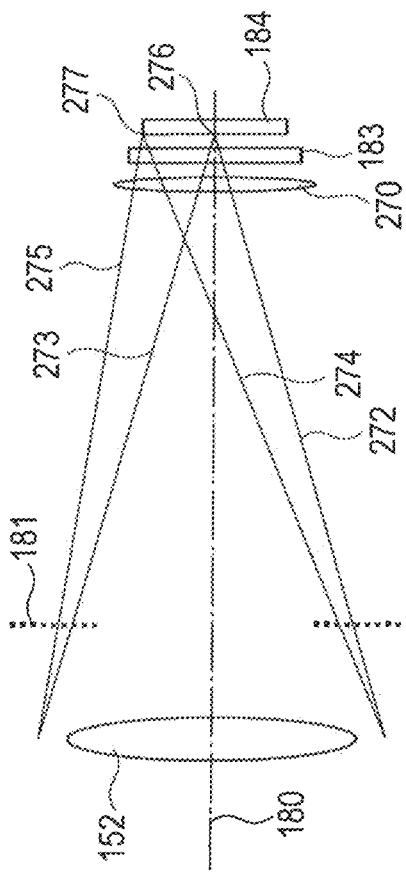
FIG. 6A and FIG. 6B are diagrams illustrating the relationship between an imaging optical system and the imaging element of the imaging device according to the first embodiment of the present invention.
Figure 6A:
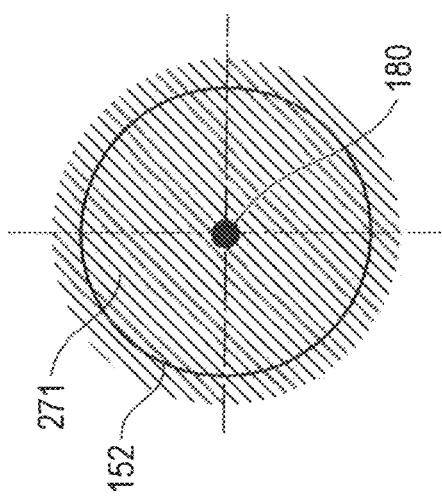

Next, a relationship between the imaging optical system 152 and the imaging element 184 will be described more specifically with reference to FIG. 6A and FIG. 6B. FIG. 6A and FIG. 6B are diagrams for describing the relationship between the imaging optical system 152 and the imaging element 184. FIG. 6A is a diagram when the imaging optical system 152 is viewed from a direction along an optical axis 180. FIG. 6B is a diagram more specifically illustrating a section from the imaging optical system 152 to the imaging element 184 in FIG. 2.

As illustrated in FIG. 6B, it is assumed that the imaging element 184 includes a pixel 276 located in a central portion of the imaging area and a pixel 277 located near the outer edge of the imaging area. In this case, the pixel 276 can receive a light flux from an area surrounded by a light beam 272 and a light beam 273. The pixel 277 can receive a light flux from an area surrounded by a light beam 274 and a light beam 275. On this occasion, since a field lens 270 is arranged between the optical filter 183 and the imaging optical system 152, the light flux received by the pixel 276 and the light flux received by the pixel 277 are overlapped near the imaging optical system 152 as indicated by an area 271 in FIG. 6A. As a result, both of the pixels can receive the light flux emitted from the imaging optical system 152 with high efficiency.

FIG. 7A to FIG. 7C are schematic diagrams for describing image signals output from the imaging element. Suppose here that color filters having predetermined optical transmittance characteristics are arranged over the pixel array 302 in the layout of a color filter array 281 illustrated in FIG. 7A. FIG. 7A schematically illustrates the pixel array 302 with the pixels 303 arranged in a matrix with six rows and eight columns, and the colors of color filters arranged on respective pixels. In FIG. 7A, R denotes a red color filter, G1 and G2 denote green color filters, and B denotes a blue color filter, respectively. The illustrated color filter array 281 is a color filter array, a so-called Bayer array, where color filters of respective colors are arranged repeatedly in each row like G1BG1B . . . , RG2RG2 . . . , G1BG1B . . . , and so on.

Output data 282, 283 illustrated in FIG. 7B and FIG. 7C are obtained from the pixel array 302 having such a color filter array 281. In FIG. 7B, g1A and g2A represent output from pixel elements 303A of the pixels 303 with the green color filters arranged thereon. bA represents output from pixel elements 303A of the pixels 303 with the blue color filter arranged thereon. rA represents output from pixel elements 303A of the pixels 303 with the red color filter arranged thereon. In FIG. 7C, g1B and g2B represent output from pixel elements 303B of the pixels 303 with the green color filters arranged thereon. bB represents output from pixel elements 303B of the pixels 303 with the blue color filter arranged thereon. rB represents output from pixel elements 303B of the pixels 303 with the red color filter arranged thereon.

As described with reference to FIG. 3, two types of output from a pixel element 303A and output from a pixel element 303B can be obtained from the imaging element 184. One type of output is the output data 282 illustrated in FIG. 7B, and the other type of output is the output data 283 illustrated in FIG. 7C. The output data 282 are subjected to predetermined signal processing to generate a first image signal "picture A." The output data 283 are subjected to predetermined signal processing to generate a second image signal "picture B." In the following description, the image signal based on the output data 282 is referred to as "picture A," and the imaging signal based on the output data 283 is referred to as "picture B." Although the "picture A" and "picture B" are image signals after being subjected to a predetermined correction in a precise sense, image signals before or during the correction may also be referred to as the "picture A" and "picture B" for the purpose of explanation.

Figure 8:
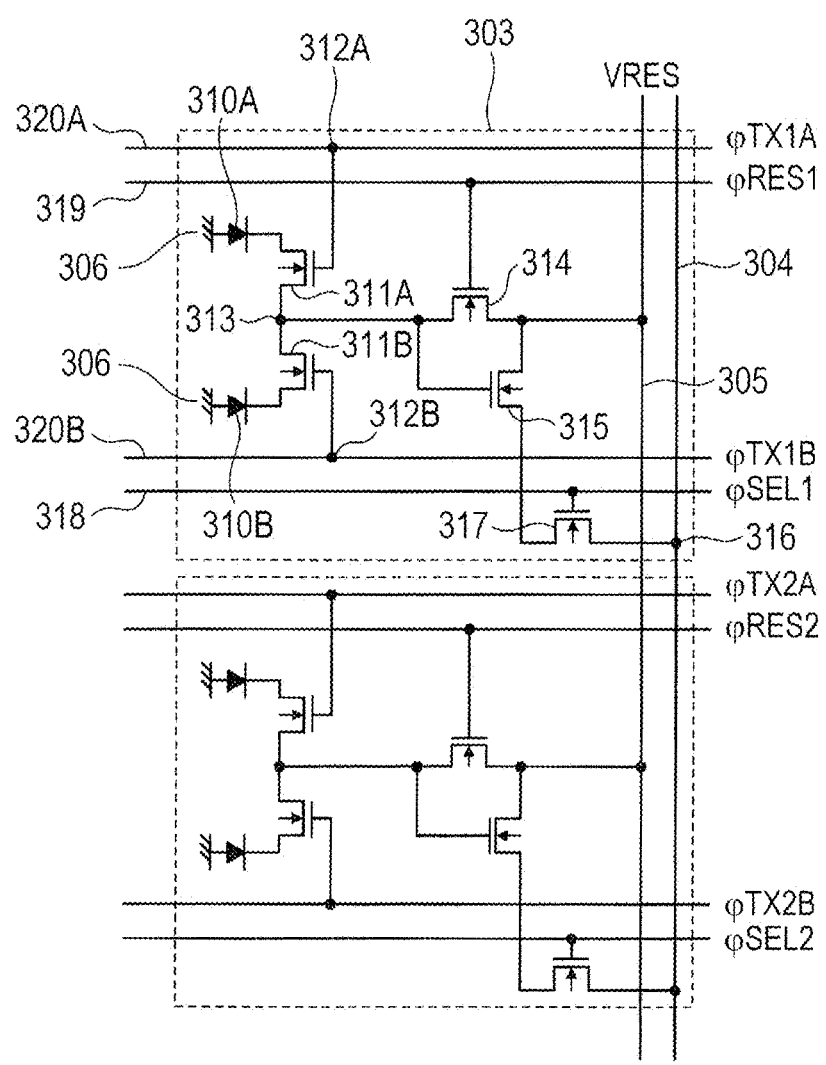
FIG. 8 is a circuit diagram illustrating a configuration example of each pixel of the imaging element of the imaging device according to the first embodiment of the present invention.

FIG. 8 is a circuit diagram illustrating a configuration example of each pixel 303. As mentioned above, the pixel 303 includes the pixel element 303A and the pixel element 303B. The pixel element 303A is composed of the photodiode 310A, a transfer transistor 311A, a floating diffusion region 313, a reset transistor 314, an amplifier transistor 315, and a select transistor 317. The pixel element 303B is composed of the photodiode 310B, a transfer transistor 311B, the floating diffusion region 313, the reset transistor 314, the amplifier transistor 315, and the select transistor 317. The floating diffusion region 313, the reset transistor 314, the amplifier transistor 315, and the select transistor 317 are shared between the pixel element 303A and the pixel element 303B. Thus, the areas of the photodiode regions can be widened. The photodiode 310A corresponds to the photodiode 310A illustrated in FIG. 4, and the photodiode 310B corresponds to the photodiode 310B illustrated in FIG. 4.

The anode of the photodiode 310A is connected to the ground line 306, and the cathode of the photodiode 310A is connected to the source of the transfer transistor 311A. The anode of the photodiode 310B is connected to the ground line 306, and the cathode of the photodiode 310B is connected to the source of the transfer transistor 311B. The drains of the transfer transistors 311A and 311B are connected to the source of the reset transistor 314 and the gate of the amplifier transistor 315. A connection node of the drains of the transfer transistors 311A and 311B, the source of the reset transistor 314, and the gate of the amplifier transistor 315 forms the floating diffusion region 313. The drain of the reset transistor 314 and the drain of the amplifier transistor 315 are connected to the power source line 305 to which voltage VRES is supplied. The source of the amplifier transistor 315 is connected to the drain of the select transistor 317. The source of the select transistor 317 that forms a pixel signal output part 316 is connected to the signal output line 304.

The pixels 303 in each column are connected to a select signal line 318, a reset control line 319, and transfer control lines 320A, 320B arranged for each row in the row direction from the vertical scanning circuit 307. The select signal line 318 is connected to the gate of the select transistor 317. The reset control line 319 is connected to the gate of the reset transistor 314. The transfer control line 320A is connected to the gate of the transfer transistor 311A via a contact part 312A. The transfer control line 320B is connected to the gate of the transfer transistor 311B via a contact part 312B. The reset control line 319 supplies the reset pulse φRESn, output from the vertical scanning circuit 307, to the gate of the reset transistor 314. The transfer control line 320A supplies the transfer pulse φTXnA, output from the vertical scanning circuit 307, to the gate of the transfer transistor 311A. The transfer control line 320B supplies the transfer pulse φTXnB, output from the vertical scanning circuit 307, to the gate of the transfer transistor 311B. Note that n attached to the reset pulse φRESn, the transfer pulse φTXnA, and the transfer pulse φTXnB is an integer corresponding to the row number. In FIG. 8, n is replaced by an integer corresponding to the row number.

The photodiode 310A is a first photoelectric conversion unit that generates electric charge by photoelectric conversion, and the photodiode 310B is a second photoelectric conversion unit that generates electric charge by photoelectric conversion. The floating diffusion region 313 is a region to accumulate electric charge. The transfer transistor 311A transfers, to the floating diffusion region 313, the electric charge generated by the photodiode 310A. The transfer transistor 311B transfers, to the floating diffusion region 313, the electric charge generated by the photodiode 310B.

When a high-level transfer pulse φTXnA is output from the vertical scanning circuit 307, the transfer transistor 311A is turned on to connect the photodiode 310A and the floating diffusion region 313. Similarly, when a high-level transfer pulse φTXnB is output from the vertical scanning circuit 307, the transfer transistor 311B is turned on to connect the photodiode 310B and the floating diffusion region 313. When a high-level reset pulse φRESn is output from the vertical scanning circuit 307, the reset transistor 314 is turned on to reset the photodiodes 310A, 310B, and the floating diffusion region 313.

When a low-level transfer pulse φTXnA is output from the vertical scanning circuit 307, the transfer transistor 311A is turned off to cause the photodiode 310A to start accumulating signal charge generated by the photoelectric conversion. After that, when the high-level transfer pulse φTXnA is output from the vertical scanning circuit 307, the transfer transistor 311A is turned on to transfer the signal charge accumulated by the photodiode 310A to the floating diffusion region 313. Then, the amplifier transistor 315 amplifies the voltage of the floating diffusion region 313 according to the amount of signal charge transferred from the photodiode 310A. When a high-level select pulse φSELn is output from the vertical scanning circuit 307, the select transistor 317 is turned on to output the voltage amplified by the amplifier transistor 315 to the signal output line 304 via the select transistor 317.

Similarly, when a low-level transfer pulse φTXnB is output from the vertical scanning circuit 307, the transfer transistor 311B is turned off to cause the photodiode 310B to start accumulating signal charge generated by the photoelectric conversion. After that, when the high-level transfer pulse φTXnB is output from the vertical scanning circuit 307, the transfer transistor 311B is turned on to transfer the signal charge accumulated by the photodiode 310B to the floating diffusion region 313. Then, the amplifier transistor 315 amplifies the voltage of the floating diffusion region 313 according to the amount of signal charge transferred from the photodiode 310B. When the high-level select pulse φSELn is output from the vertical scanning circuit 307, the select transistor 317 is turned on to output the voltage amplified by the amplifier transistor 315 to the signal output line 304 via the select transistor 317.

Figure 9:
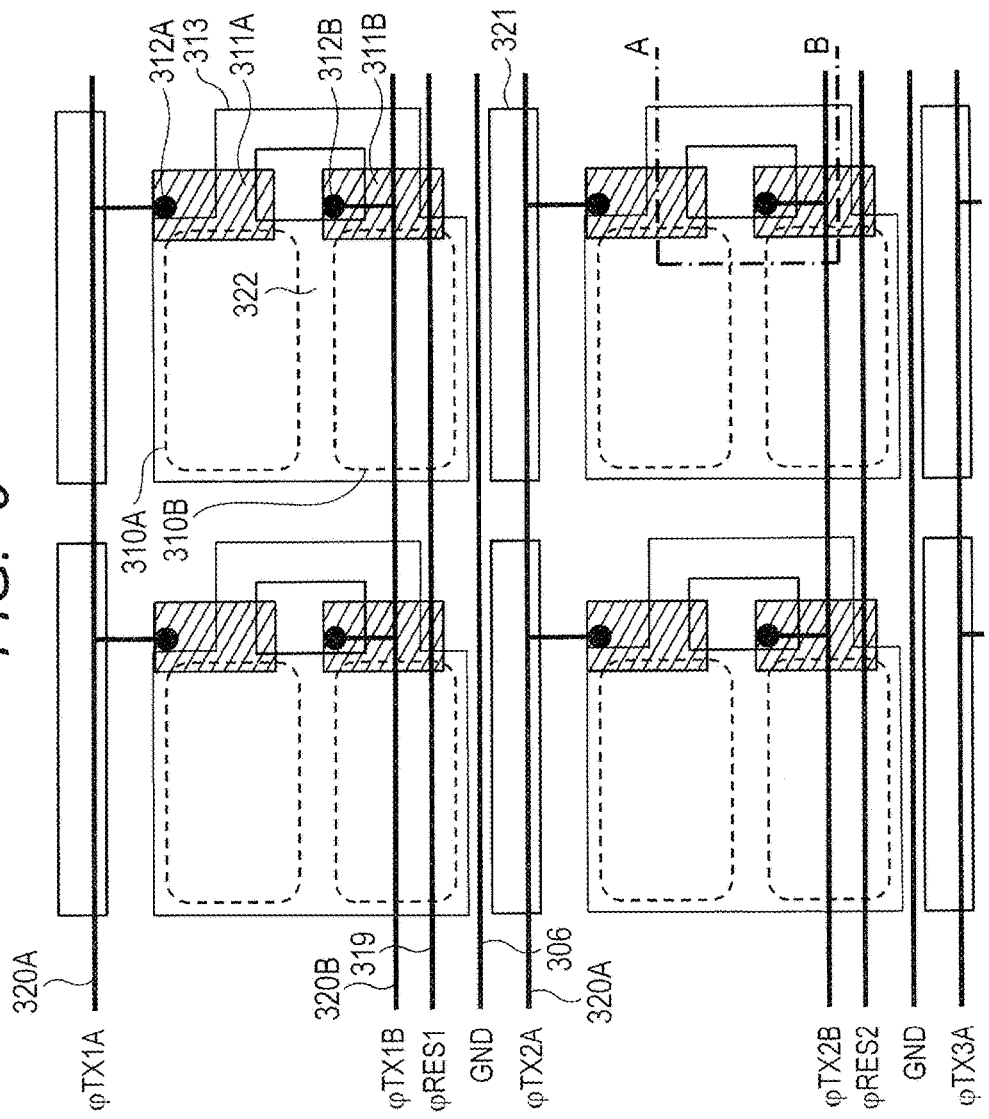
FIG. 9 and FIG. 10 are planar layout diagrams illustrating the main part of each pixel of the imaging element of the imaging device according to the first embodiment of the present invention.
Figure 10:
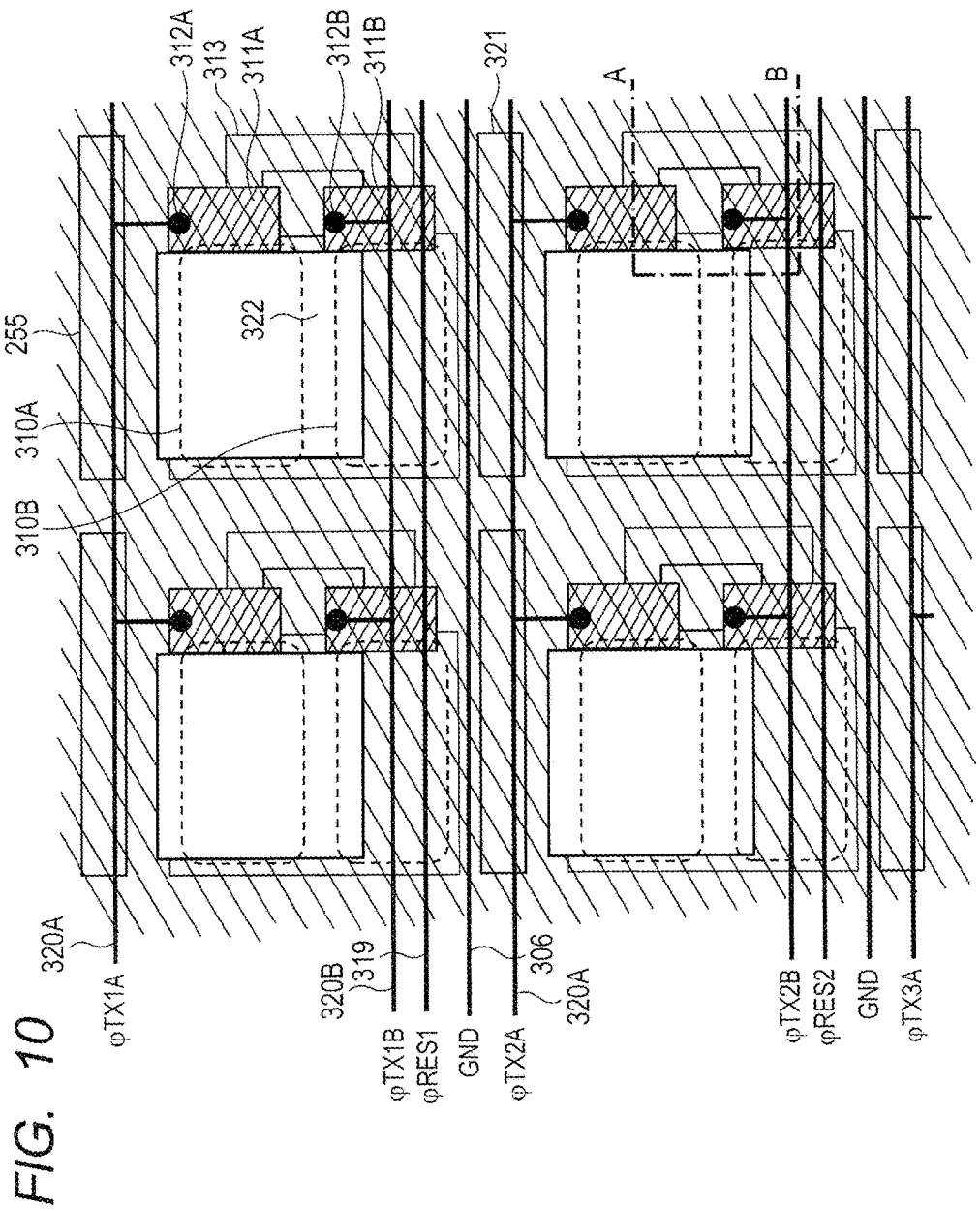

FIG. 9 and FIG. 10 are planar layout diagrams illustrating the main part of each pixel 303. Among the constituent elements of the pixel 303, the photodiodes 310A, 310B, the transfer transistors 311A, 311B, and the floating diffusion region 313 are illustrated in FIG. 9. The other circuit elements including the reset transistor 314, the amplifier transistor 315, and the select transistor 317 are represented as a readout circuit 321 in FIG. 9 to omit detailed illustration. Further, the signal output line 304 and the power source line 305 arranged in the vertical direction of the pixel 303 are omitted, and the contact parts of the reset control line 319, the power source line 305, and the ground line 306 are omitted. In addition to the constituent elements illustrated in FIG. 9, the light guide 255 described with reference to FIG. 4 is illustrated in FIG. 10. In the light guide 255, the shaded area indicates a low refractive index area and the outlined blank area indicates a high refractive index area, namely a light guiding area.

In FIG. 9 and FIG. 10, the contact part 312A is a contact part to connect the transfer control line 320A and the gate of the transfer transistor 311A. The contact part 312B is a contact part to connect the transfer control line 320B and the gate of the transfer transistor 311B. Each of the photodiodes 310A, 310B is a photoelectric conversion unit that performs the photoelectric conversion, having a first conductivity-type (e.g., p-type) semiconductor region and a second conductivity-type (e.g., n-type) semiconductor region (n-type electron accumulation region) to form a p-n junction with the first conductivity-type semiconductor region. The second conductivity-type semiconductor region of the photodiode 310A and the second conductivity-type semiconductor region of the photodiode 310B are isolated by an isolation part 322.

The transfer transistors 311A, 311B, the contact parts 312A, 312B, and the transfer control lines 320A, 320B are arranged line-symmetric or substantially line-symmetric to the isolation part 322 between the photodiodes 310A, 310B, respectively. On the other hand, the light guide 255 is arranged in a position deviated from the isolation part 322 as illustrated in FIG. 10. In other words, the photodiode 310A occupies most of the area of the bottom of the light guide 255, whereas the photodiode 310B slightly overlaps the bottom of the light guide 255. Therefore, the light-receiving efficiency of the photodiode 310A is relatively high, and the light-receiving efficiency of the photodiode 310B is relatively low.

In the imaging element 184 according to the present embodiment, the ratio of the light-receiving efficiency between the photodiodes 310A and 310B is set to about 8:1, i.e., the difference in sensitivity is set to about three steps. Then, two images are shot in the settings of different accumulation times to obtain nearly equal signal charge in each of two pixel elements. This can make both images be noiseless images having excellent S/N ratios, or can synthesize both images to obtain a high-definition HDR image. The details will be described later.

Figure 11:
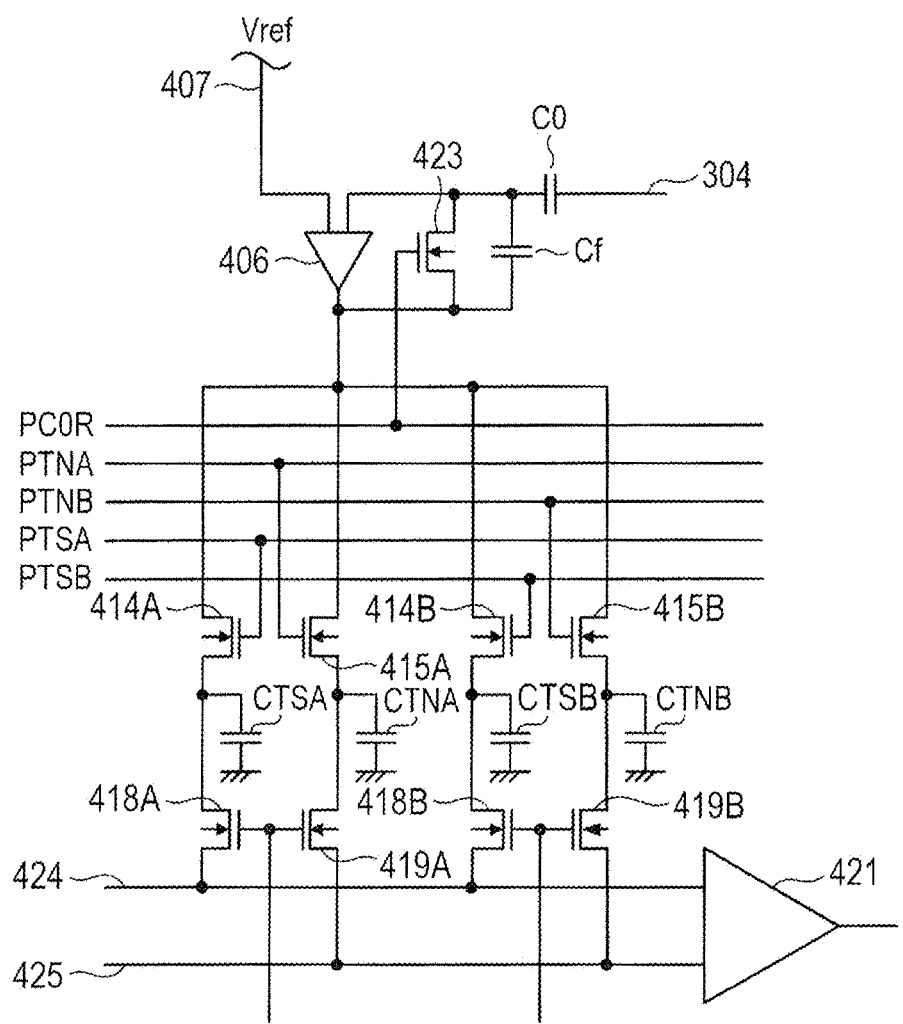
FIG. 11 is a circuit diagram illustrating a configuration example of readout circuits of the imaging element of the imaging device according to the first embodiment of the present invention.

FIG. 11 is a circuit diagram illustrating a configuration example of the readout circuit 308 of the imaging element 184.

As illustrated in FIG. 11, the readout circuit 308 includes a clamp capacitor C0, a feedback capacitor Cf, an operational amplifier 406, a reference voltage source 407, and a switch 423. One input terminal of the operational amplifier 406 is connected to the signal output line 304 via the clamp capacitor C0. The feedback capacitor Cf and the switch 423 are connected in parallel between the one input terminal and the output terminal of the operational amplifier 406. The other input terminal of the operational amplifier is connected to the reference voltage source 407. The reference voltage source 407 supplies a reference voltage Vref to the operational amplifier 406. The switch 423 is a switch controlled by a signal PC0R to be turned on when the signal PC0R is at high level so as to short-circuit both ends of the feedback capacitor Cf.

The readout circuit 308 also includes switches 414A, 415A, 414B, 415B, 418A, 418B, 419A, and 419B, capacitors CTSA, CTNA, CTSB, and CTNB, horizontal output lines 424 and 425, and an output amplifier 421. The switches 414A, 415A, 414B, and 415B are switches that control the writing of pixel signals to the capacitors CTSA, CTNA, CTSB, and CTNB, respectively. The switch 414A is a switch controlled by a signal PTSA to be turned on when the signal PTSA is at high level so as to connect the output terminal of the operational amplifier 406 and the capacitor CTSA. The switch 415A is a switch controlled by a signal PTNA to be turned on when the signal PTNA is at high level so as to connect the output terminal of the operational amplifier 406 and the capacitor CTNA. The switch 414B is a switch controlled by a signal PTSB to be turned on when the signal PTSB is at high level so as to connect the output terminal of the operational amplifier 406 and the capacitor CTSB. The switch 415B is a switch controlled by a signal PTNB to be turned on when the signal PTNB is at high level so as to connect the output terminal of the operational amplifier 406 and the capacitor CTNB.

The switches 418A, 419A, 418B, and 419B are switches to control the output of pixel signals, held in the capacitors CTSA, CTNA, CTSB, and CTNB, to the output amplifier 421. The switches 418A, 419A, 418B, and 419B are turned on in response to a control signal from a horizontal shift register. Thus, the signal written in the capacitor CTSA is output to the output amplifier 421 via the switch 418A and the horizontal output line 424. The signal written in the capacitor CTNA is output to the output amplifier 421 via the switch 419A and the horizontal output line 425. The signal written in the capacitor CTSB is output to the output amplifier 421 via the switch 418B and the horizontal output line 424. The signal written in the capacitor CTNB is output to the output amplifier 421 via the switch 419B and the horizontal output line 425.

The signal PC0R, the signal PTNA, the signal PTSA, the signal PTNB, and the signal PTSB are signals supplied from the timing generation unit 189 under the control of the system control CPU 178 as a control unit.

Figure 12:
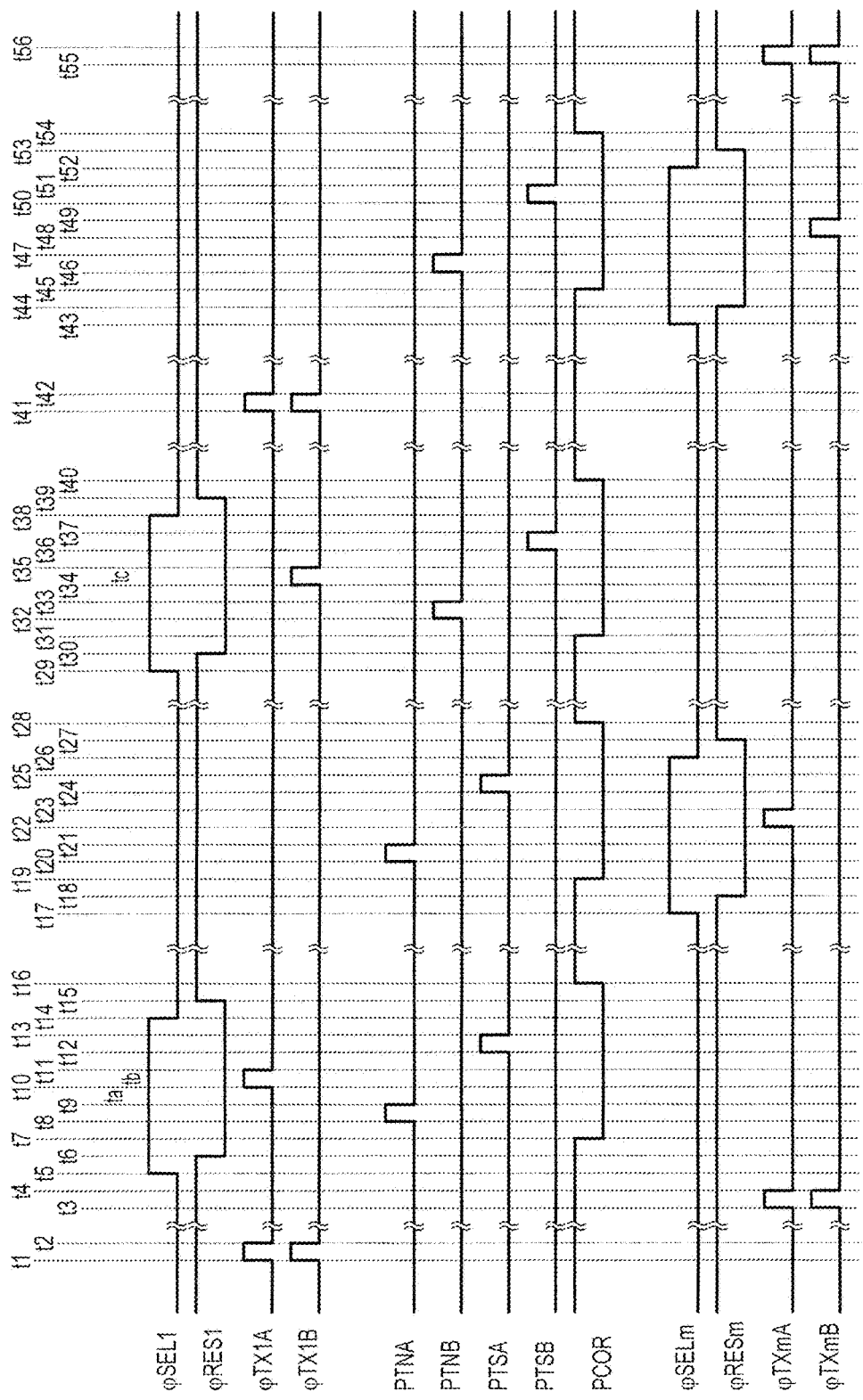
FIG. 12 is a timing chart illustrating a driving sequence of the imaging element in the imaging device according to the first embodiment of the present invention.

Next, a method of driving the imaging device according to the present embodiment will be described with reference to a timing chart in FIG. 12. Here, it is assumed that the imaging element 184 includes m rows of the pixel array 302. FIG. 12 illustrates an example where control is performed to make the accumulation start timing of the photodiode 310A, which forms part of the pixel element 303A of each of the pixels 303 arranged on the same line, identical to the accumulation start timing of the photodiode 310B that forms part of the pixel element 303B.

First, at time t1, the vertical scanning circuit 307 changes the transfer pulses φTX1A, φTX1B supplied to the transfer control lines 320A, 320B from the low level to the high level. Thus, the transfer transistors 311A, 311B are turned on. At this time, since the high-level reset pulse φRES1 is supplied to the reset control line 319 from the vertical scanning circuit 307, the reset transistor 314 is also in the on-state. Therefore, the photodiodes 310A, 310B of each pixel 303 in the first row are connected to the power source line 305 via the transfer transistors 311A, 311B and the reset transistor 314 to get into the reset state. On this occasion, the floating diffusion region 313 is also in the reset state.

Then, at time t2, the vertical scanning circuit 307 changes the transfer pulses φTX1A, φTX1B from the high level to the low level. Thus, the transfer transistors 311A, 311B are turned off to cause the photodiodes 310A, 310B of each pixel 303 in the first row to start accumulating signal charge by the photoelectric conversion. In other words, time t2 is the start of the accumulation period of the photodiodes 310A, 310B of each pixel 303 in the first row.

Then, the same procedure is repeatedly performed to cause the photodiodes 310A, 310B of each pixel 303 to start accumulating signal charge sequentially from the second row to the (m−1)-th row.

Then, at time t3, the vertical scanning circuit 307 changes the transfer pulses φTXmA, φTXmB supplied to the transfer control lines 320A, 320B from the low level to the high level. Thus, like in the first row, the photodiodes 310A, 310B of each pixel 303 in the m-th row are reset.

Then, at time t4, the vertical scanning circuit 307 changes the transfer pulses φTXmA, φTXmB from the high level to the low level. Thus, the photodiodes 310A, 310B of each pixel 303 in the m-th row starts accumulating signal charge. In other words, time t4 is the start of the accumulation period of the photodiodes 310A, 310B of each pixel 303 in the m-th row.

Then, at time t5, the vertical scanning circuit 307 changes the select pulse φSEL1 supplied to the select signal line from the low level to the high level to turn on the select transistor 317 of each pixel 303 in the first row. Thus, the pixels 303 in the first row are selected.

Then, at time t6, the vertical scanning circuit 307 changes the reset pulse φRES1 from the high level to the low level. Thus, the reset transistor 314 of the pixel 303 in the first row is turned off to release the reset state of the floating diffusion region 313. Accordingly, the potential of the floating diffusion region 313 is set to a reset signal level, read out to the signal output line 304 via the amplifier transistor 315 and the select transistor 317, and input to the readout circuit 308.

At time t6, since the high-level signal PC0R is supplied from the timing generation unit 189 to the readout circuit 308, the switch 423 is in the on-state. Therefore, the pixel signal of the reset signal level is input to the readout circuit 308 in a state where the operational amplifier 406 buffers the output of the reference voltage Vref.

Then, at time t7, the signal PC0R supplied from the timing generation unit 189 to the readout circuit 308 is changed from the high level to the low level to turn off the switch 423. Thus, in the readout circuit 308, voltage which is subjected to inverted gain with respect to a voltage change at a capacitance ratio between the clamp capacitor C0 and the feedback capacitor Cf with respect to the pixel signal of the reset signal level is output from the operational amplifier 406.

Then, at time t8, the signal PTNA supplied from the timing generation unit 189 to the readout circuit 308 is changed from the low level to the high level to turn on the switch 415A so that the output of the operational amplifier 406 at the time will be written to the capacitor CTNA.

Then, at time t9, the signal PTNA supplied from the timing generation unit 189 to the readout circuit 308 is changed from the high level to the low level to turn off the switch 415A so as to complete the writing to the capacitor CTNA.

Then, at time t10, the vertical scanning circuit 307 changes the transfer pulse φTX1A from the low level to the high level to turn on the transfer transistor 311A. Thus, the signal charge accumulated in the photodiode 310A is transferred to the floating diffusion region 313.

Then, at time t11, the vertical scanning circuit 307 changes the transfer pulse φTX1A from the high level to the low level to turn off the transfer transistor 311A. Thus, the readout of the signal charge accumulated in the photodiode 310A into the floating diffusion region 313 is completed. In other words, time t11 is the end of the accumulation period of the photodiode 310A of the pixel 303 in the first row. The accumulation period of the photodiode 310A of the pixel 303 in the first row is from time t2 to time t11.

Accordingly, the potential of the floating diffusion region 313 changed by the signal charge is read out as an optical signal level to the signal output line 304 via the amplifier transistor 315 and the select transistor 317, and input to the readout circuit 308. Then, in the readout circuit 308, voltage which is subjected to inverted gain with respect to a voltage change at a capacitance ratio between the clamp capacitor C0 and the feedback capacitor Cf with respect to the pixel signal of the optical signal level is output from the operational amplifier 406.

Then, at time t12, the signal PTSA supplied from the timing generation unit 189 to the readout circuit 308 is changed from the low level to the high level to turn on the switch 414A so that the output of the operational amplifier 406 at the time will be written to the capacitor CTSA.

Then, at time t13, the signal PTSA supplied from the timing generation unit 189 to the readout circuit 308 is changed from the high level to the low level to turn off the switch 414A so as to complete the writing to the capacitor CTSA.

Then, at time t14, the vertical scanning circuit 307 changes the select pulse φSEL1 from the high level to the low level to turn off the select transistor 317 of the pixel 303 in the first row so as to release the selection of the pixels 303 in the first row.

After that, the switches 418A, 419A are turned on sequentially from column to column in response to the signal from the horizontal shift register. Thus, the signal written in the capacitor CTSA and the signal written in the capacitor CTNA are input to the output amplifier 421 via the horizontal output line 424 and the horizontal output line 425, respectively.

Accordingly, readout from the pixel element 303A of the pixel 303 of each column in the first row is performed.

Then, readout from the pixel element 303A of the pixel 303 of each column in the second row to the (m−1)-th row is performed in the same manner as the readout from the pixel element 303A of the pixel 303 of each column in the first row described above.

Then, at time t15, the vertical scanning circuit 307 changes the reset pulse φRES1 from the low level to the high level to turn on the reset transistor 314. Therefore, the floating diffusion region 313 is connected to the power source line 305 via the reset transistor 314 to get into the reset state.

Then, at time t16, the timing generation unit 189 changes the signal PC0R from the low level to the high level to turn on the switch 423. Thus, the operational amplifier 406 gets into a state of buffering the output of the reference voltage Vref.

Then, at time t17, the vertical scanning circuit 307 changes the select pulse φSELm from the low level to the high level to turn on the select transistor 317 of each pixel 303 in the m-th row. Thus, the pixels 303 in the m-th row are selected.

Then, at time t18, the vertical scanning circuit 307 changes the reset pulse φRESm from the high level to the low level. Thus, the reset transistor 314 of the pixel 303 in the m-th row is turned off to release the reset state of the floating diffusion region 313. Accordingly, the potential of the floating diffusion region 313 is set to the reset signal level, read out to the signal output line 304 via the amplifier transistor 315 and the select transistor 317, and input to the readout circuit 308.

At time t18, since the high-level signal PC0R is supplied from the timing generation unit 189 to the readout circuit 308, the switch 423 is in the on-state. Therefore, the pixel signal of the reset signal level is input to the readout circuit 308 in the state where the operational amplifier 406 buffers the output of the reference voltage Vref.

Then, at time t19, the signal PC0R supplied from the timing generation unit 189 to the readout circuit 308 is changed from the high level to the low level to turn off the switch 423. Thus, in the readout circuit 308, voltage which is subjected to inverted gain with respect to a voltage change at a capacitance ratio between the clamp capacitor C0 and the feedback capacitor Cf with respect to the pixel signal of the reset signal level is output from the operational amplifier 406.

Then, at time t20, the signal PTNA supplied from the timing generation unit 189 to the readout circuit 308 is changed from the low level to the high level to turn on the switch 415A so that the output of the operational amplifier 406 at the time will be written to the capacitor CTNA.

Then, at time t21, the signal PTNA supplied from the timing generation unit 189 to the readout circuit 308 is changed from the high level to the low level to turn off the switch 415A so as to complete the writing to the capacitor CTNA.

Then, at time t22, the vertical scanning circuit 307 changes the transfer pulse φTXmA from the low level to the high level to turn on the transfer transistor 311A. Thus, the signal charge accumulated in the photodiode 310A is transferred to the floating diffusion region 313.

Then, at time t23, the vertical scanning circuit 307 changes the transfer pulse φTXmA from the high level to the low level to turn off the transfer transistor 311A. Thus, the readout of the signal charge accumulated in the photodiode 310A into the floating diffusion region 313 is completed. In other words, time t23 is the end of the accumulation period of the photodiode 310A of the pixel 303 in the m-th row. The accumulation period of the photodiode 310A of the pixel 303 in the m-th row is from time t4 to time t23.

Accordingly, the potential of the floating diffusion region 313 changed by the signal charge is set to the optical signal level, read out to the signal output line 304 via the amplifier transistor 315 and the select transistor 317, and input to the readout circuit 308. Then, in the readout circuit 308, voltage which is subjected to inverted gain with respect to a voltage change at a capacitance ratio between the clamp capacitor C0 and the feedback capacitor Cf with respect to the pixel signal of the optical signal level is output from the operational amplifier 406.

Then, at time t24, the signal PTSA supplied from the timing generation unit 189 to the readout circuit 308 is changed from the low level to the high level to turn on the switch 414A so that the output of the operational amplifier 406 at the time will be written to the capacitor CTSA.

Then, at time t25, the signal PTSA supplied from the timing generation unit 189 to the readout circuit 308 is changed from the high level to the low level to turn off the switch 414A so as to complete the writing to the capacitor CTSA.

Then, at time t26, the vertical scanning circuit 307 changes the select pulse φSELm from the high level to the low level to turn off the select transistor 317 of the pixel 303 in the m-th row so as to release the selection of the pixels 303 in the m-th row.

After that, the switches 418A, 419A are turned on sequentially from column to column in response to the signal from the horizontal shift register. Thus, the signal written in the capacitor CTSA and the signal written in the capacitor CTNA are input to the output amplifier 421 via the horizontal output line 424 and the horizontal output line 425, respectively.

Accordingly, readout from the pixel element 303A of the pixel 303 of each column in the m-th row is performed.

The above-mentioned readout from the pixel element 303A of the pixel 303 of each pixel from the first row to the m-th row is performed during the accumulation period of the pixel element 303B. In other words, the readout from the pixel element 303A is completed before readout from the pixel element 303B to be performed later. Therefore, the readout operation from the pixel element 303A does not affect the frame rate related to readout from the pixel element 303B.

Then, at time t27, the vertical scanning circuit 307 changes the reset pulse φRESm from the low level to the high level to turn on the reset transistor 314. Therefore, the floating diffusion region 313 is connected to the power source line 305 via the reset transistor 314 to get into the reset state.

Then, at time t28, the timing generation unit 189 changes the signal PC0R from the low level to the high level to turn on the switch 423. Thus, the operational amplifier 406 gets into the state of buffering the output of the reference voltage Vref.

Then, the readout from the pixel element 303B is started after the readout from the pixel element 303A is completed and a predetermined time corresponding to the accumulation time of the pixel element 303B lapses.

At time t29 after the lapse of the predetermined time, the vertical scanning circuit 307 changes the select pulse φSEL1 from the low level to the high level to turn on the select transistor 317 of each pixel 303 in the first row. Thus, the pixels 303 in the first row are selected.

Then, at time t30, the vertical scanning circuit 307 changes the reset pulse φRES1 from the high level to the low level. Thus, the reset transistor 314 of the pixel 303 in the first row is turned off to release the reset state of the floating diffusion region 313. Accordingly, the potential of the floating diffusion region 313 is set to the reset signal level, read out to the signal output line 304 via the amplifier transistor 315 and the select transistor 317, and input to the readout circuit 308.

At time t30, since the high-level signal PC0R is supplied from the timing generation unit 189 to the readout circuit 308, the switch 423 is in the on-state. Therefore, the pixel signal of the reset signal level is input to the readout circuit 308 in the state where the operational amplifier 406 buffers the output of the reference voltage Vref.

Then, at time t31, the signal PC0R supplied from the timing generation unit 189 to the readout circuit 308 is changed from the high level to the low level to turn off the switch 423. Thus, in the readout circuit 308, voltage which is subjected to inverted gain with respect to a voltage change at a capacitance ratio between the clamp capacitor C0 and the feedback capacitor Cf with respect to the pixel signal of the reset signal level is output from the operational amplifier 406.

Then, at time t32, the signal PTNB supplied from the timing generation unit 189 to the readout circuit 308 is changed from the low level to the high level to turn on the switch 415B so that the output of the operational amplifier 406 at the time will be written to the capacitor CTNB.

Then, at time t33, the signal PTNB supplied from the timing generation unit 189 to the readout circuit 308 is changed from the high level to the low level to turn off the switch 415B so as to complete the writing to the capacitor CTNB.

Then, at time t34, the vertical scanning circuit 307 changes the transfer pulse φTX1B from the low level to the high level to turn on the transfer transistor 311B. Thus, the signal charge accumulated in the photodiode 310B is transferred to the floating diffusion region 313.

Then, at time t35, the vertical scanning circuit 307 changes the transfer pulse φTX1B from the high level to the low level to turn off the transfer transistor 311B. Thus, the readout of the signal charge accumulated in the photodiode 310B into the floating diffusion region 313 is completed. In other words, time t35 is the end of the accumulation period of the photodiode 310B of the pixel 303 in the first row. The accumulation period of the photodiode 310B of the pixel 303 in the first row is from time t2 to time t35.

Accordingly, the potential of the floating diffusion region 313 changed by the signal charge is set to the optical signal level, read out to the signal output line 304 via the amplifier transistor 315 and the select transistor 317, and input to the readout circuit 308. Then, in the readout circuit 308, voltage which is subjected to inverted gain with respect to a voltage change at a capacitance ratio between the clamp capacitor C0 and the feedback capacitor Cf with respect to the pixel signal of the optical signal level is output from the operational amplifier 406.

In the method of driving the imaging device according to the present embodiment, the accumulation time of the photodiode 310B of the pixel element 303B is set constant. The accumulation time of the photodiode 310B is set appropriately in a manner to be described later so that a high-definition moving image with less so-called jerkiness like frame-by-frame advance can be obtained.

For example, a second set time T2 as a parameter to control the accumulation timing of the photodiode 310A of the pixel element 303A is set to half the accumulation time of the photodiode 310B of the pixel element 303B, i.e., to T2=(t35−t2)/2. The method of controlling the accumulation timing of the photodiode 310A of the pixel element 303A using the second set time T2 will be described later.

Then, at time t36, the signal PTSB supplied from the timing generation unit 189 to the readout circuit 308 is changed from the low level to the high level to turn on the switch 414B so that the output of the operational amplifier 406 at the time will be written to the capacitor CTSB.

Then, at time t37, the signal PTSB supplied from the timing generation unit 189 to the readout circuit 308 is changed from the high level to the low level to turn off the switch 414B so as to complete the writing to the capacitor CTSB.

Then, at time t38, the vertical scanning circuit 307 changes the select pulse ϕSEL1 from the high level to the low level to turn off the select transistor 317 of the pixel 303 in the first row so as to release the selection of the pixels 303 in the first row.

After that, the switches 418B, 419B are turned on sequentially from column to column in response to the signal from the horizontal shift register. Thus, the signal written in the capacitor CTSB and the signal written in the capacitor CTNB are input to the output amplifier 421 via the horizontal output line 424 and the horizontal output line 425, respectively.

Accordingly, readout from the pixel element 303B of the pixel 303 of each column in the first row is performed.

Then, at time t39, the vertical scanning circuit 307 changes the reset pulse ϕRES1 from the low level to the high level to turn on the reset transistor 314. Therefore, the floating diffusion region 313 is connected to the power source line 305 via the reset transistor 314 to get into the reset state.

Then, at time t40, the timing generation unit 189 changes the signal PC0R from the low level to the high level to turn on the switch 423. Thus, the operational amplifier 406 gets into the state of buffering the output of the reference voltage Vref.

Then, at time t41, the vertical scanning circuit 307 changes the transfer pulses ϕTX1A, ϕTX1B supplied to the transfer control lines 320A, 320B from the low level to the high level. Therefore, the transfer transistors 311A, 311B are turned on. At this time, since the high-level reset pulse ϕRES1 is supplied to the reset control line 319 from the vertical scanning circuit 307, the reset transistor 314 is also in the on-state. Therefore, the photodiodes 310A, 310B of each pixel 303 in the first row are connected to the power source line 305 via the transfer transistors 311A, 311B and the reset transistor 314 to get into the reset state. On this occasion, the floating diffusion region 313 is also in the reset state.

Then, at time t42, the vertical scanning circuit 307 changes the transfer pulses ϕTX1A, ϕTX1B from the high level to the low level. Thus, the transfer transistors 311A, 311B are turned off to cause the photodiodes 310A, 310B of each pixel 303 in the first row to start accumulating signal charge by the photoelectric conversion. Further, the photodiodes 310A, 310B of each pixel 303 in each row start accumulating signal charge in sequential order. In other words, time t42 is the start of the accumulation period of the photodiodes 310A, 310B of each pixel 303 in the first row for the next frame.

Then, readout from the pixel element 303B of the pixel 303 of each column from the second row to the (m−1)-th row is performed in the same manner as the readout from the pixel element 303B of the pixel 303 of each column in the first row mentioned above.

Then, at time t43, the vertical scanning circuit 307 changes the select pulse ϕSELm from the low level to the high level to turn on the select transistor 317 of each pixel 303 in the m-th row. Thus, the pixels 303 in the m-th row are selected.

Then, at time t44, the vertical scanning circuit 307 changes the reset pulse ϕRESm from the high level to the low level. Thus, the reset transistor 314 of the pixel 303 in the m-th row is turned off to release the reset state of the floating diffusion region 313. Accordingly, the potential of the floating diffusion region 313 is set to the reset signal level, read out to the signal output line 304 via the amplifier transistor 315 and the select transistor 317, and input to the readout circuit 308.

At time t44, since the high-level signal PC0R is supplied from the timing generation unit 189 to the readout circuit 308, the switch 423 is in the on-state. Therefore, the pixel signal of the reset signal level is input to the readout circuit 308 in the state where the operational amplifier 406 buffers the output of the reference voltage Vref.

Then, at time t45, the signal PC0R supplied from the timing generation unit 189 to the readout circuit 308 is changed from the high level to the low level to turn off the switch 423. Thus, in the readout circuit 308, voltage which is subjected to inverted gain with respect to a voltage change at a capacitance ratio between the clamp capacitor C0 and the feedback capacitor Cf with respect to the pixel signal of the reset signal level is output from the operational amplifier 406.

Then, at time t46, the signal PTNB supplied from the timing generation unit 189 to the readout circuit 308 is changed from the low level to the high level to turn on the switch 415B so that the output of the operational amplifier 406 at the time will be written to the capacitor CTNB.

Then, at time t47, the signal PTNB supplied from the timing generation unit 189 to the readout circuit 308 is changed from the high level to the low level to turn off the switch 415B so as to complete the writing to the capacitor CTNB.

Then, at time t48, the vertical scanning circuit 307 changes the transfer pulse ϕTXmB from the low level to the high level to turn on the transfer transistor 311B. Thus, the signal charge accumulated in the photodiode 310B is transferred to the floating diffusion region 313.

Then, at time t49, the vertical scanning circuit 307 changes the transfer pulse ϕTXmB from the high level to the low level to turn off the transfer transistor 311B. Thus, the readout of the signal charge accumulated in the photodiode 310B into the floating diffusion region 313 is completed. In other words, time t49 is the end of the accumulation period of the photodiode 310B of the pixel 303 in the m-th row. The accumulation period of the photodiode 310B of the pixel 303 in the m-th row is from time t4 to time t49.

Accordingly, the potential of the floating diffusion region 313 changed by the signal charge is set to the optical signal level, read out to the signal output line 304 via the amplifier transistor 315 and the select transistor 317, and input to the readout circuit 308. Then, in the readout circuit 308, voltage which is subjected to inverted gain with respect to a voltage change at a capacitance ratio between the clamp capacitor C0 and the feedback capacitor Cf with respect to the pixel signal of the optical signal level is output from the operational amplifier 406.

Then, at time t50, the signal PTSB supplied from the timing generation unit 189 to the readout circuit 308 is changed from the low level to the high level to turn on the switch 414B so that the output of the operational amplifier 406 at the time will be written to the capacitor CTSB.

Then, at time t51, the signal PTSB supplied from the timing generation unit 189 to the readout circuit 308 is changed from the high level to the low level to turn off the switch 414B so as to complete the writing to the capacitor CTSB.

Then, at time t52, the vertical scanning circuit 307 changes the select pulse φSELm from the high level to the low level to turn off the select transistor 317 of the pixel 303 in the m-th row so as to release the selection of the pixels 303 in the m-th row.

After that, the switches 418B, 419B are turned on sequentially from column to column in response to the signal from the horizontal shift register. Thus, the signal written in the capacitor CTSB and the signal written in the capacitor CTNB are input to the output amplifier 421 via the horizontal output line 424 and the horizontal output line 425, respectively.

Accordingly, readout from the pixel element 303B of the pixel 303 of each column in the m-th row is performed.

Then, at time t53, the vertical scanning circuit 307 changes the reset pulse φRESm from the low level to the high level to turn on the reset transistor 314. Therefore, the floating diffusion region 313 is connected to the power source line 305 via the reset transistor 314 to get into the reset state.

Then, at time t54, the timing generation unit 189 changes the signal PC0R from the low level to the high level to turn on the switch 423. Thus, the operational amplifier 406 gets into the state of buffering the output of the reference voltage Vref.

Then, at time t55, the vertical scanning circuit 307 changes transfer pulses φTXmA, φTXmB supplied to the transfer control lines 320A, 320B from the low level to the high level. Thus, the transfer transistors 311A, 311B are turned on. At this time, since the high-level reset pulse φRESm is output to the reset control line 319 from the vertical scanning circuit 307, the reset transistor 314 is also in the on-state. Therefore, the photodiodes 310A, 310B of each pixel 303 in the m-th row are connected to the power source line 305 via the transfer transistors 311A, 311B and the reset transistor 314 to get into the reset state. On this occasion, the floating diffusion region 313 is also in the reset state.

Then, at time t56, the vertical scanning circuit 307 changes the transfer pulses φTXmA, φTXmB from the high level to the low level. Thus, the transfer transistors 311A, 311B are turned off to cause the photodiodes 310A, 310B of each pixel 303 in the m-th row to start accumulating signal charge by the photoelectric conversion. In other words, time t56 is the start of the accumulation period of the photodiodes 310A, 310B of each pixel 303 in the m-th row for the next frame.

For example, a first set time T1 as a parameter to control the accumulation timing of the photodiode 310A of the pixel element 303A is set to a time corresponding to a period of reading out all the pixel elements 303B, i.e., to T1=t56−t35. The method of controlling the accumulation timing of the photodiode 310A of the pixel element 303A using the first set time T1 will be described later.

Figure 13A:
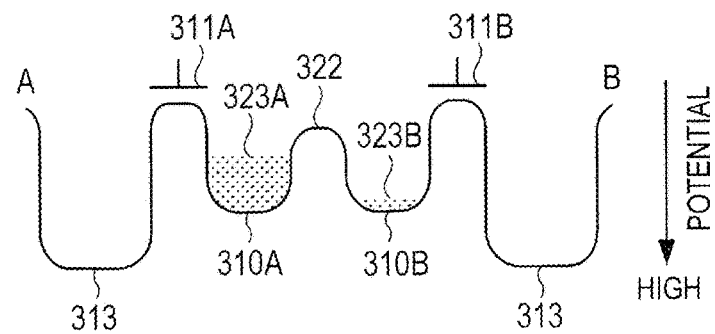
FIG. 13A, FIG. 13B, and FIG. 13C are potential diagrams of the pixel taken along A-B line in FIG. 9.
Figure 13B:
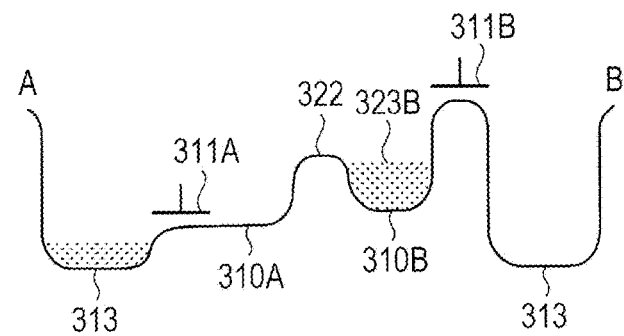
Figure 13C:
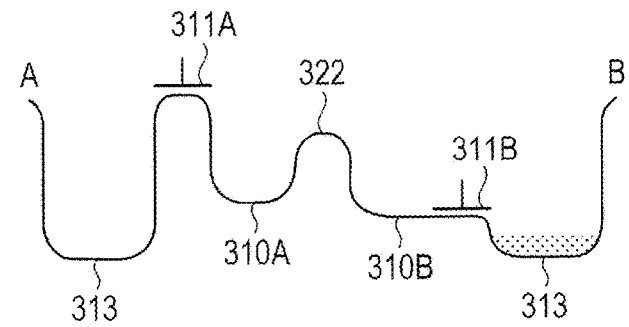

FIG. 13A to FIG. 13C are potential diagrams of the pixel 303 taken along A-B line in FIG. 9. FIG. 13A is a potential diagram at time ta in FIG. 12, FIG. 13B is a potential diagram at time tb in FIG. 12, and FIG. 13C is a potential diagram at time tc in FIG. 12.

As illustrated in FIG. 13A, the transfer transistors 311A, 311B are in the off-state at time ta, and signal charges at signal accumulation levels 323A, 323B are accumulated in the photodiodes 310A, 310B, respectively. As mentioned above, since the photodiode 310A and the photodiode 310B are different in light-receiving efficiency, the signal accumulation level 323A is higher than the signal accumulation level 323B at the same time.

As illustrated in FIG. 13B, the transfer transistor 311A is in the on-state at time tb. In this case, the potential barrier of the transfer transistor 311A is low, and the signal charge accumulated in the photodiode 310A is transferred to the floating diffusion region 313. At this time, the potential barrier of the isolation part 322 is also low due to lowering of the potential barrier of the transfer transistor 311A. However, since the potential barrier of the transfer transistor 311A is sufficiently low, such a phenomenon that the signal charge accumulated in the photodiode 310A at this timing leaks into the adjacent photodiode 310B via the isolation part 322 seldom occurs.

As illustrated in FIG. 13C, the transfer transistor 311B is in the on-state at time tc. In this case, the potential barrier of the transfer transistor 311B is low, and the signal charge accumulated in the photodiode 310B is transferred to the floating diffusion region 313. At this time, the signal charge accumulated in the photodiode 310A is read out to the readout circuit 308. Further, the potential barrier of the isolation part 322 is also low due to lowering of the potential barrier of the transfer transistor 311B. However, since the potential barrier of the transfer transistor 311B is sufficiently low, such a phenomenon that the signal charge accumulated in the photodiode 310B at this timing leaks into the adjacent photodiode 310A via the isolation part 322 seldom occurs.

Figure 14:
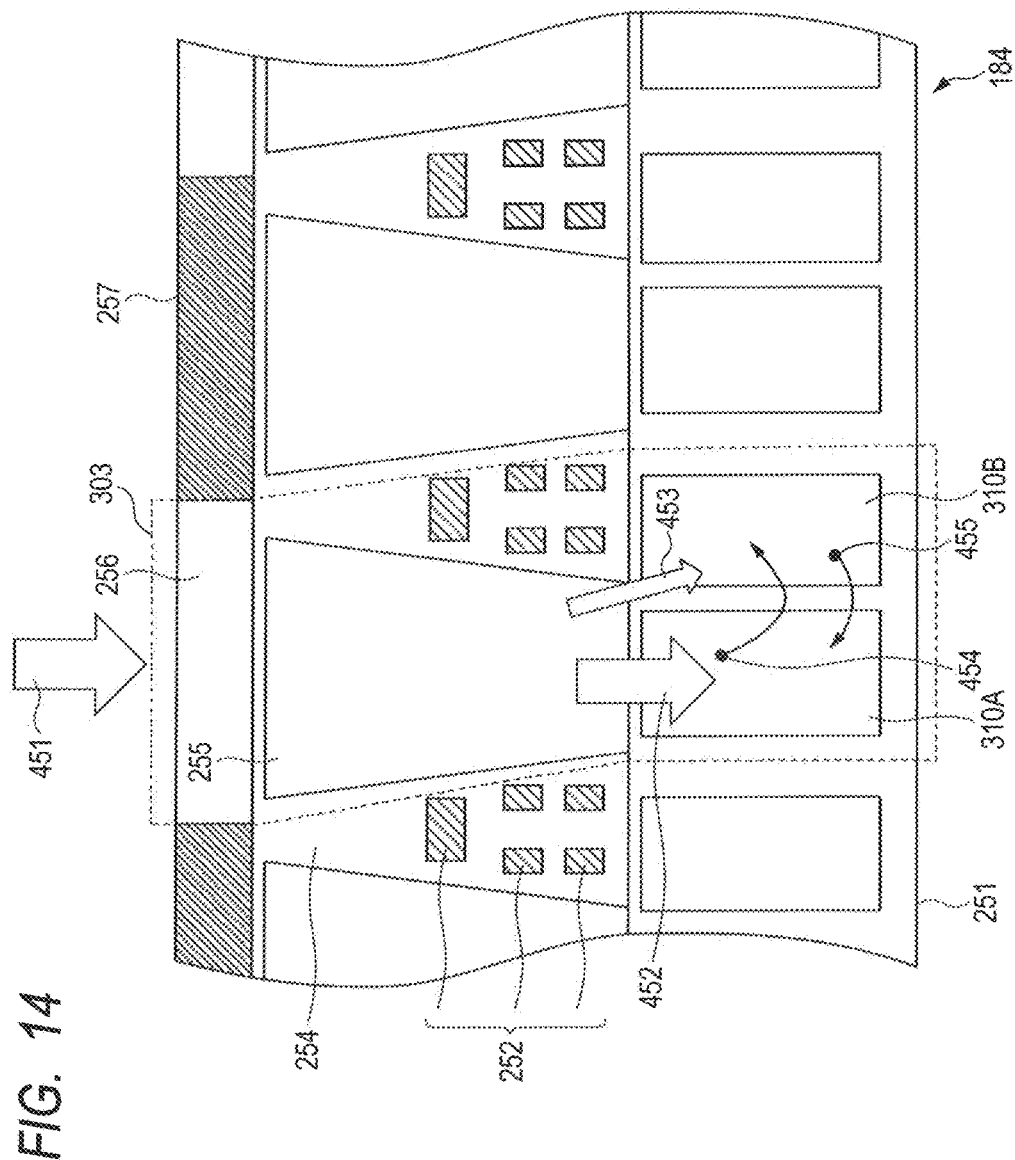
FIG. 14 is a cross-sectional view illustrating the propagation of light and the behavior of electric charges inside the imaging element.

FIG. 14 is a cross-sectional view illustrating the propagation of light and the behavior of electric charges generated by photoelectric conversion inside the imaging element 184. A light flux 451 entering the pixel 303 first enters the color filter 256, where a predetermined wavelength component is absorbed, passes through an interfacial passivation film (not illustrated) corresponding to the uppermost part of the insulating layer 254, and enters the light guide 255. As described above with reference to FIG. 5, orientation information of the light beam, i.e., pupil information is lost inside the light guide 255 by the behavior of light waves. The light flux 451 moves on the side of the silicon substrate 251 while being confined in the light guide 255 due to the refractive index difference between the light guide 255 and the insulating layer 254, and reaches the bottom of the light guide 255. The bottom of the light guide 255 lies adjacent to the silicon substrate 251, and the light flux emitted from the light guide 255 enters the silicon substrate 251. The photodiode 310A and the photodiode 310B provided adjacent to each other inside the silicon substrate 251 are arranged to be greatly eccentric from the light guide 255. Therefore, a light flux 452 as most of the light flux emitted from the light guide 255 enters the photodiode 310A, and a light flux 453 as part of the rest of the light flux emitted from the light guide 255 enters the photodiode 310B. The incident photons are converted to signal charges in the photodiodes 310A, 310B.

On this occasion, signal charges generated inside the silicon substrate 251 of the imaging element 184 may leak into adjacent pixel elements by diffusion. For example, signal charge 454 generated in the photodiode 310A leaks into the photodiode 310B by diffusion. Further, signal charge 455 generated in the photodiode 310B leaks into the photodiode 310A by diffusion. This phenomenon has an adverse effect on the image, resulting in a blur in the image.

Figure 15:
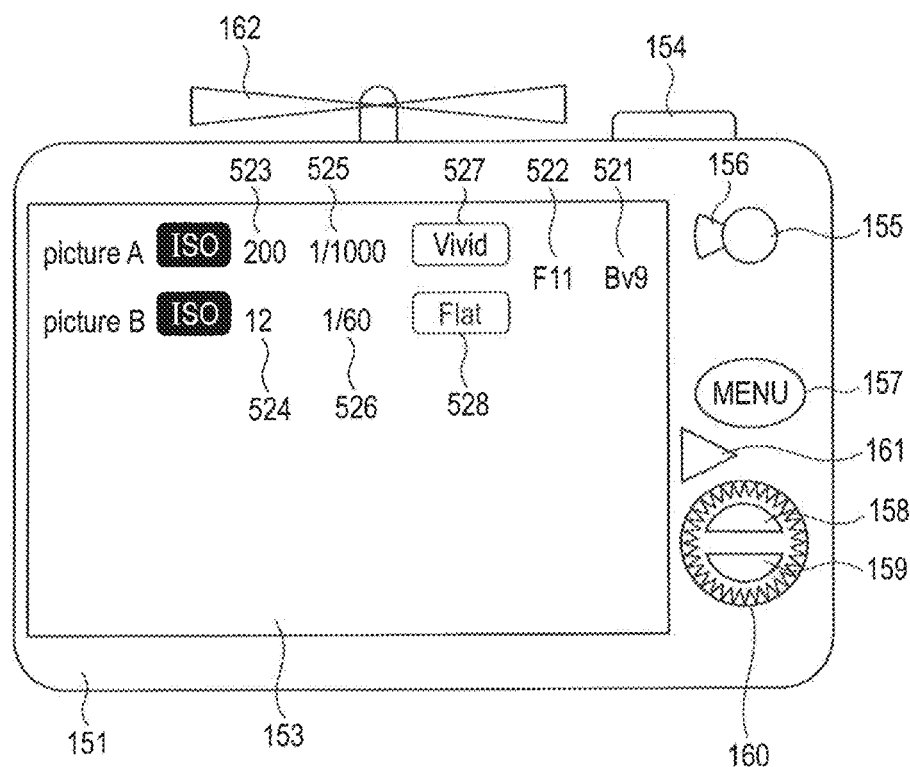
FIG. 15 is a diagram for describing a shooting condition setting screen for "picture A" and "picture B."

FIG. 15 is a diagram for describing a shooting condition setting screen for "picture A" and "picture B." It is assumed that the shooting mode selecting lever 156 is rotated 90 degrees clockwise, for example, from the position in FIG. 1B to enter a dual image mode capable of shooting two images at the same time. A Bv value 521, an F-number 522, and respective ISO sensitivities 523, 524 and shutter speeds 525, 526 of the "picture A" and the "picture B" corresponding to the brightness of an object at the time are displayed on the display unit 153. Further, image modes 527, 528 currently set for the "picture A" and the "picture B" are displayed, respectively. An image mode to suit the purpose of shooting can be selected from among plural options using the up and down switches 158, 159, and the dial 160.

Figure 16:
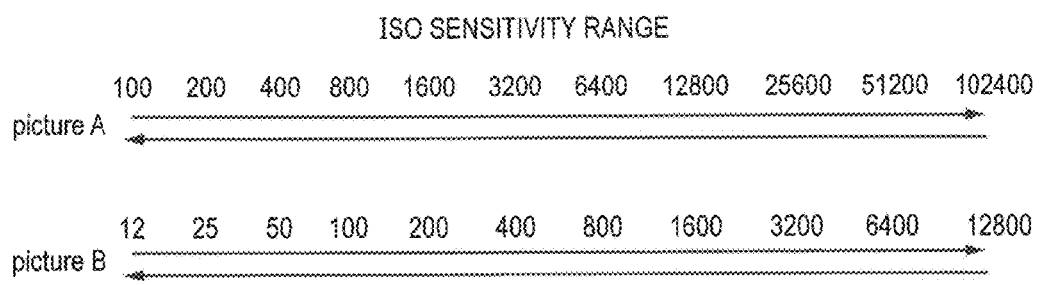
FIG. 16 is a diagram illustrating a relationship between ISO sensitivity ranges of "picture A" and "picture B."

As mentioned above, the difference in light-receiving efficiency between the photodiode 310A and the photodiode 310B is set as a three-step difference. Therefore, there is a three-step difference in ISO sensitivity range between the "picture A" and the "picture B." As illustrated in FIG. 16, the ISO sensitivity range of the "picture A" is from ISO 100 to ISO 102400, and the ISO sensitivity range of the "picture B" is from ISO 12 to ISO 12800.

Figure 17:
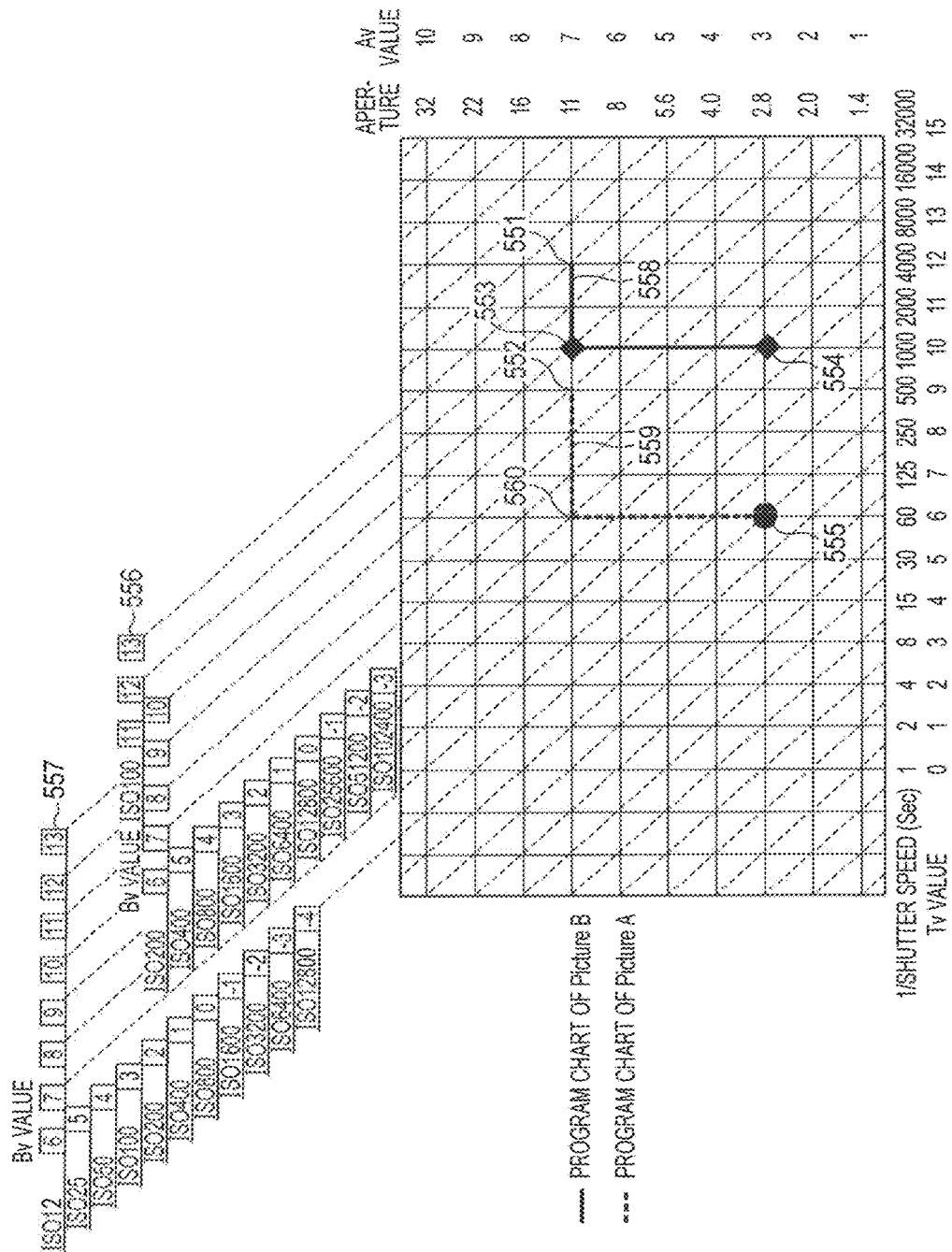
FIG. 17 is a program AE chart in a dual image mode of the imaging device according to the first embodiment of the present invention.

FIG. 17 is a program AE (Automatic Exposure) chart in the dual image mode. The abscissa indicates Tv value and corresponding shutter speed, and the ordinate indicates Av value and corresponding aperture value. Further, the diagonal direction is equivalent Bv line. The relationship between the Bv value and the ISO sensitivity of the "picture A" is represented in a gain notation area 556, and the relationship between the Bv value and the ISO sensitivity of the "picture B" is represented in a gain notation area 557. In FIG. 17, each Bv value is represented as a numeric value surrounded by a rectangle to distinguish from the other parameters.

Referring to FIG. 17, it will be described how the shutter speed, the aperture value, and the ISO sensitivity vary according to variations from high brightness to low brightness.

First, when the Bv value is 13, the ISO sensitivity of the "picture A" is set to ISO 100. The equivalent Bv line of the "picture A" intersects with a program chart 558 of the "picture A" at point 551, and it is determined from the point 551 that the shutter speed is 1/4000 second and the aperture value is F11. On the other hand, the ISO sensitivity of the "picture B" is set to ISO 12. The equivalent Bv line of the "picture B" intersects with a program chart 559 of the "picture B" at point 552, and it is determined from the point 552 that the shutter speed is 1/500 second and the aperture value is F11.

When the Bv value is 10, the ISO sensitivity of the "picture A" increases by one step and is set to ISO 200. The equivalent Bv line of the "picture A" intersects with the program chart 558 of the "picture A" at point 553, and it is determined from the point 553 that the shutter speed is 1/1000 and the aperture value is F11. On the other hand, the ISO sensitivity of the "picture B" is set to ISO 12. The equivalent Bv line of the "picture B" intersects with the program chart 559 of the "picture B" at point 560, and it is determined from the point 560 that the shutter speed is 1/60 and the aperture value is F11.

When the Bv value is 6, the ISO sensitivity of the "picture A" is set to ISO 200. The equivalent Bv line of the "picture A" intersects with the program chart 558 of the "picture A" at point 554, and it is determined from the point 554 that the shutter speed is 1/1000 second and the aperture value is F2.8. On the other hand, the ISO sensitivity of the "picture B" is set to ISO 12. The equivalent Bv line of the "picture B" intersects with the program chart 559 of the "picture B" at point 555, and it is determined from the point 555 that the shutter speed is 1/60 second and the aperture value is F2.8.

When the Bv value is 5, the ISO sensitivity of the "picture A" increases by one step and is set to ISO 400. The equivalent Bv line of the "picture A" intersects with the program chart 558 of the "picture A" at the point 554, and it is determined from the point 554 that the shutter speed is 1/1000 second and the aperture value is F2.8. On the other hand, the ISO sensitivity of the "picture B" is set to ISO 25. The equivalent Bv line of the "picture B" intersects with the program chart 559 of the "picture B" at the point 555, and it is determined from the point 555 that the shutter speed is 1/60 second and the aperture value is F2.8.

After that, as the brightness is reduced, gain-up is performed to increase the ISO sensitivity without changing the shutter speed and the aperture value of both of the "picture A" and the "picture B."

The exposure operation illustrated in this program AE chart is so performed that the "picture A" will keep a shutter speed of 1/1000 second or faster over the entire brightness range illustrated, and the "picture B" will keep a shutter speed of 1/60 second over most of the brightness range. Thus, a high-definition moving image with less so-called jerkiness like frame-by-frame advance can be obtained in the "picture B" while achieving a stop motion effect in the "picture A."

In general, when the shutter speed is fast at the time of shooting a moving image, so-called jerkiness like frame-by-frame advance appears upon playback to cause the smoothness of the image to be lost. In order to obtain a smooth image with less jerkiness, there is a need to set an accumulation time close to one frame period in a series of shooting processes. In other words, if the frame rate is 30 fps, a relatively longer accumulation time, such as 1/30 second or 1/60 second, will be adequate. Particularly, in such a situation that the attitude of a camera is unstable such as a helicopter shot, this setting is important.

On the other hand, a still image is required to shoot an image of a moment with less blur, i.e., an image having a so-called stop motion effect. Therefore, there is a need to set a short accumulation time, for example, about 1/1000 second. Further, in the case of a moving image at a high frame rate, one frame period is short. Therefore, for example, if the frame rate is 120 fps, a short accumulation time such as 1/125 second or 1/250 second is inevitably set.

Shooting two images at the same time through a single photographic lens, such as a moving image and a still image, or a moving image at a normal frame rate and a moving image at a high frame rate, means that the aperture values used to shooting these images are the same. Even in this case, it is desired that similar levels of signal charge should be obtained in the imaging element while shooting two images in different accumulation time settings to obtain noiseless images having excellent S/N ratios.

Figure 18:
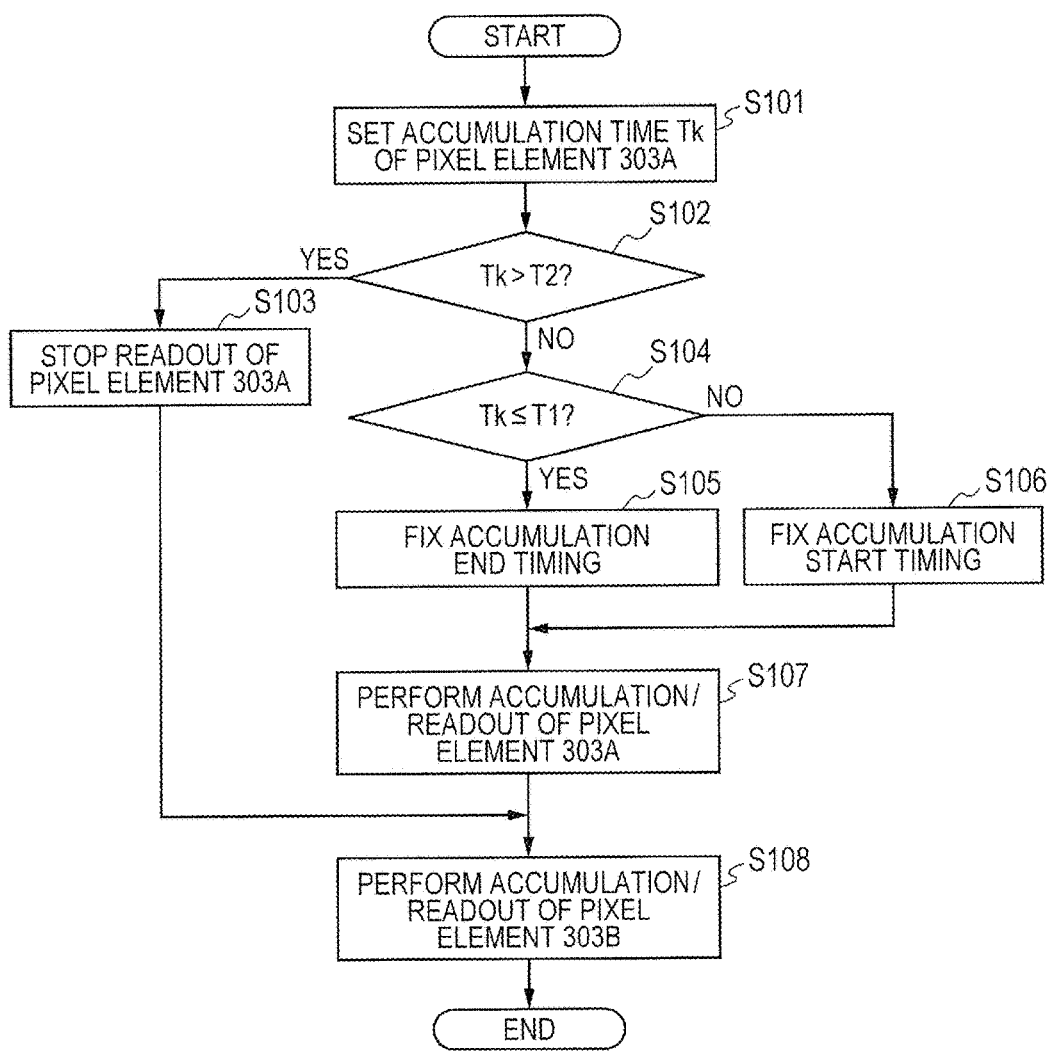
FIG. 18 is a flowchart illustrating an accumulation control method in the imaging device according to the first embodiment of the present invention.

FIG. 18 is a flowchart illustrating a method of driving the imaging device according to the present embodiment. In the method of driving the imaging device according to the present embodiment, the presence or absence of readout of the pixel element 303A, and the accumulation start timing or the accumulation end timing of the pixel element 303A are changed according to the accumulation time of the pixel element 303A. Specifically, the accumulation and readout of the pixel elements 303A, 303B are performed according to the procedure of step S101 to step S108 illustrated in FIG. 18.

First, when the brightness of an object is detected, an accumulation time Tk of the pixel element 303A is set according to the brightness of the object detected in step S101.

Then, in step S102, it is determined whether the set accumulation time Tk of the pixel element 303A is longer than a second set time T2. Here, it is assumed that the second set time T2 is set to half the accumulation time of the pixel element 303B. However, the second set time T2 may not be necessarily half the accumulation time of the pixel element 303B. In an example, the second set time T2 can be set as the longest accumulation time capable of expecting the stop motion effect.

When the accumulation time Tk of the pixel element 303A is longer than the second set time T2 ("YES" in FIG. 18), the procedure proceeds to step S103. In this case, since "picture A" obtained from the output of the pixel element 303A cannot be expected to have the stop motion effect, the readout from the pixel element 303A is stopped (step S103), and the procedure proceeds to step S108.

On the other hand, when the accumulation time Tk of the pixel element 303A is the second set time T2 or less ("NO" in FIG. 18), the procedure proceeds to step S104.

In step S104, it is determined whether the accumulation time Tk of the pixel element 303A is the first set time T1 or less. Here, it is assumed that the first set time T1 is set to a time corresponding to a period required to read out all the pixel elements 303B in the imaging element 184 (e.g., a period from time t35 to time t56).

When the accumulation time Tk of the pixel element 303A is the first set time T1 or less ("YES" in FIG. 18), the procedure proceeds to step S105. In step S105, the control unit sets an accumulation period of the pixel element 303A in such a manner that the accumulation period of the pixel element 303A will be completed after the readout period of the pixel element 303B in the previous frame. In an example, the accumulation period of the pixel element 303A is so set that the timing of completing the accumulation period of the pixel element 303A in the first row will coincide with the timing of starting the accumulation period of the pixel element 303B in the m-th row. In other words, the accumulation period of the pixel element 303A is so set that the end timing of the accumulation period of the pixel element 303A will be fixed to a predetermined time according to the accumulation period of the pixel element 303B.

On the other hand, when the accumulation time Tk of the pixel element 303A is longer than the first set time T1 ("NO" in FIG. 18), the procedure proceeds to step S106. In step S106, the control unit sets the accumulation period of the pixel element 303A in such a manner that the accumulation period of the pixel element 303A will not be completed during the readout period of the pixel element 303B in the previous frame. In an example, the accumulation period of the pixel element 303A is so set that the timing of starting the accumulation period of the pixel element 303A in the first row will coincide with the timing of starting the accumulation period of the pixel element 303B in the first row. In other words, the start timing of the accumulation period of the pixel element 303A is set to be fixed to a predetermined time according to the accumulation period of the pixel element 303B.

After the accumulation period of the pixel element 303A is set in step S105 or step S106, the procedure proceeds to step S107.

When the accumulation timing of the pixel element 303A is set, the control unit performs in step S107 the accumulation and readout of the pixel element 303A. After the accumulation and readout of the pixel element 303A are completed, the procedure proceeds to step S108.

Then, in step S108, the control unit performs the accumulation and readout of the pixel element 303B.

Figure 19A:
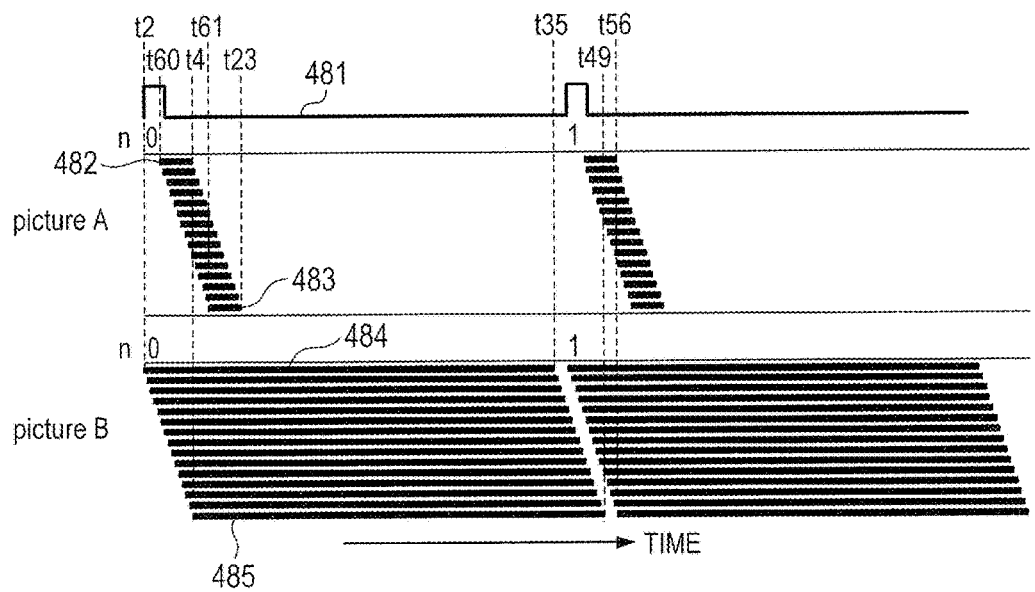
FIG. 19A and FIG. 19B are charts for describing a shutter speed difference between "picture A" and "picture B" along imaging sequences.
Figure 19B:
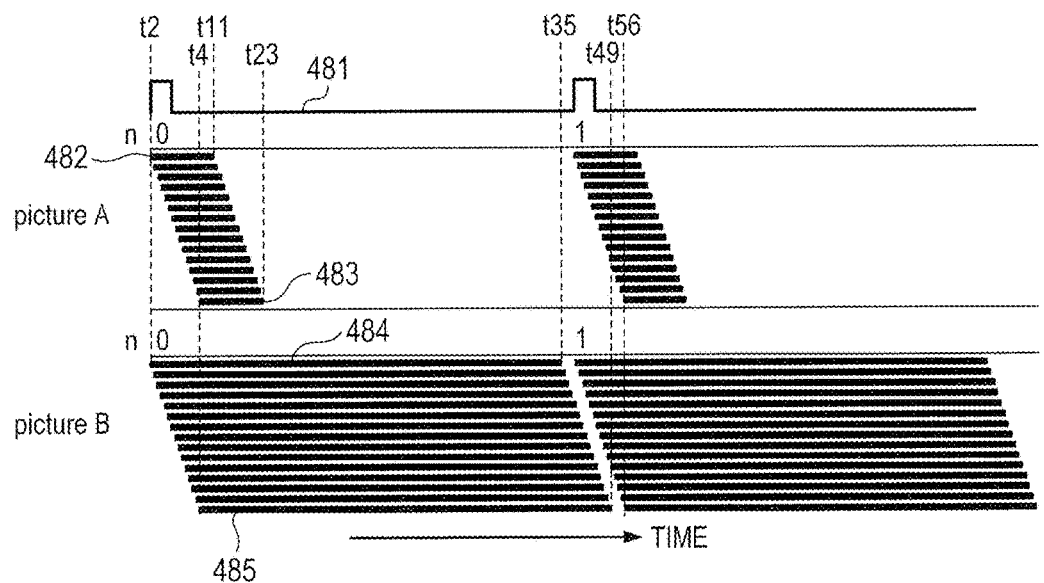

A method of setting the accumulation period of the pixel element 303A in step S105 and step S106 will be described in more detail with reference to FIG. 19A and FIG. 19B. FIG. 19A and FIG. 19B are charts for describing a shutter speed difference between the "picture A" as the output of the pixel element 303A and the "picture B" as the output of the pixel element 303B along an imaging sequence. In FIG. 19A and FIG. 19B, the abscissa is expressed in time to illustrate a V synchronizing signal 481, accumulation periods 482, 483 of the "picture A," and accumulation periods 484, 485 of the "picture B," where n denotes a frame number.

FIG. 19A illustrates an example of an imaging sequence when the accumulation time Tk of the pixel element 303A is the first set time T1 or less (Tk≤T1). In FIG. 19A, the accumulation period 482 is an accumulation period of a screen upper edge line (the first line) of the "picture A," and the accumulation period 483 is an accumulation period of a screen lower edge line (the m-th line) of the "picture A." Since the imaging element 184 performs exposure operation with the function of a rolling electronic shutter, the accumulation is started at predetermined time intervals sequentially from the screen upper edge line toward the screen lower edge line, and the accumulation is finished sequentially at the time intervals. When the accumulation is completed, the signal charge is read out by the readout circuit 308 sequentially from the imaging element 184. A period from time t60 to time t4 is the accumulation period 482, and a period from time t61 to time t23 is the accumulation period 483.

Further, the accumulation period 484 is an accumulation period of the screen upper edge line (the first line) of "picture B", and the accumulation period 485 is an accumulation period of the screen lower edge line (the m-th line) of "picture B." Like in the "picture A," the accumulation in the "picture B" is also started sequentially at predetermined time intervals from the screen upper edge line toward the screen lower edge line, and the accumulation is finished sequentially at the time intervals. When the accumulation is completed, the signal charge is read out sequentially by the readout circuit 308. A period from time t2 to time t35 is the accumulation period 484, and a period from time t4 to time t49 is the accumulation period 485. In the method of driving the imaging device according to the present embodiment, the accumulation time of the "picture B" is fixed.

Here, in the case of Tk≤T1, if the start timings of the accumulation period of the pixel element 303A and the accumulation period of the pixel element 303B are set to be the same as each other, the readout of the pixel element 303A may be started before the readout of the pixel element 303B in the previous frame is completed. For example, when the accumulation period 482 is started at time t2, the accumulation period 482 is completed before time t4. In this case, the readout period of the pixel element 303A overlaps the readout period of the pixel element 303B in the previous frame, resulting in affecting the frame rate of the readout of the pixel element 303B.

Therefore, in the method of driving the imaging device according to the present embodiment, the end timing of the accumulation period of the pixel element 303A is set in step S105 according to the start timing of the accumulation period of the pixel element 303B. In an example, as illustrated in FIG. 19A, the accumulation period of the pixel element 303A is so set that the end timing of the accumulation period of the pixel element 303A in the first row will be the same as the start timing of the accumulation period of the pixel element 303B in the m-th row. Note that the timing of starting the accumulation period of the pixel element 303B in the m-th row is also the timing of ending the readout period of the pixel element 303B in the previous frame. Thus, the accumulation period of the pixel element 303A can be completed after the readout period of the pixel element 303B in the previous frame to prevent the frame rate of the readout of the pixel element 303B from being affected.

Note that, if the readout of the pixel element 303A in the m-th row is completed at timing before time t35, the end timing of the accumulation period of the pixel element 303A in the first row may come after the start timing of the accumulation period of the pixel element 303B in the m-th row. For example, it is also effective in setting the end timing of the accumulation period of the pixel element 303A in such a manner that the accumulation period of the pixel element 303A is completed near the middle of the accumulation period of the pixel element 303B. This has an effect of bring the center position of the accumulation time of the pixel element 303A close to the center position of the accumulation time of the pixel element 303B.

FIG. 19B illustrates an example of the imaging sequence when the accumulation time Tk of the pixel element 303A is longer than the first set time T1 (Tk>T1). In FIG. 19B, the accumulation period 482 is an accumulation period of the screen upper edge line (the first line) of the "picture A," and the accumulation period 483 is an accumulation period of the screen lower edge line (the m-th line) of the "picture A." Since the imaging element 184 performs exposure operation with the function of a rolling electronic shutter, the accumulation is starting at predetermined time intervals sequentially from the screen upper edge line toward the screen lower edge line, and the accumulation is finished sequentially at the time intervals. When the accumulation is completed, the signal charge is read out sequentially by the readout circuit 308. A period from time t2 to time t11 is the accumulation period 482, and a period from time t4 to time t23 is the accumulation period 483.

Further, the accumulation period 484 is an accumulation period of the screen upper edge line (the first line) of the "picture B," and the accumulation period 485 is an accumulation period of the screen lower edge line (the m-th line) of the "picture B." Like in the "picture A," the accumulation in the "picture B" is also started sequentially at predetermined time intervals from the screen upper edge line toward the screen lower edge line, and the accumulation is finished sequentially at the time intervals. When the accumulation is completed, the signal charge is read out sequentially by the readout circuit 308. A period from time t2 to time t35 is the accumulation period 484, and a period from time t4 to time t49 is the accumulation period 485. In the method of driving the imaging device according to the present embodiment, the accumulation time of the "picture B" is fixed.

Here, in the case of Tk>T1, if the accumulation period of the pixel element 303A is started before the start of the accumulation period of the pixel element 303B, the readout of the pixel element 303A may be started before the readout of the pixel element 303B in the previous frame is completed. For example, when the accumulation period 482 is started before time t2, it is considered that time t11 at which the accumulation period 482 is completed comes before time t4. In this case, the readout period of the pixel element 303A overlaps the readout period of the pixel element 303B in the previous frame, resulting in affecting the frame rate of the readout of the pixel element 303B.

Therefore, in the method of driving the imaging device according to the present embodiment, the start timing of the accumulation period of the pixel element 303A is set in step S106 according to the start timing of the accumulation period of the pixel element 303B. In an example, as illustrated in FIG. 19B, the accumulation period of the pixel element 303A is so set that the start timing of the accumulation period of the pixel element 303A will be the same as the start timing of the accumulation period of the pixel element 303B. Thus, the accumulation period of the pixel element 303A can be completed after the readout period of the pixel element 303B in the previous frame to prevent the frame rate of the readout of the pixel element 303B from being affected.

Note that, if the readout of the pixel element 303A in the m-th row is completed at timing before time t35, the start timing of the accumulation period of the pixel element 303A in the first row may come after the start timing of the accumulation period of the pixel element 303B in the first row. For example, it is also effective in setting the start timing of the accumulation period of the pixel element 303A in such a manner that the accumulation period of the pixel element 303A is completed near the middle of the accumulation period of the pixel element 303B. This has an effect of bring the center position of the accumulation time of the pixel element 303A close to the center position of the accumulation time of the pixel element 303B.

Accordingly, in the method of driving the imaging device according to the present embodiment, the accumulation period of the pixel element 303A is so controlled that the readout period of the pixel element 303A will not overlap the readout period of the pixel element 303B. More specifically, the readout of the pixel element 303A is completed during the accumulation time of the pixel element 303B and before the readout of the pixel element 303B to prevent the readout of the pixel element 303A from affecting the frame rate of the readout of the pixel element 303B.

Figure 20:
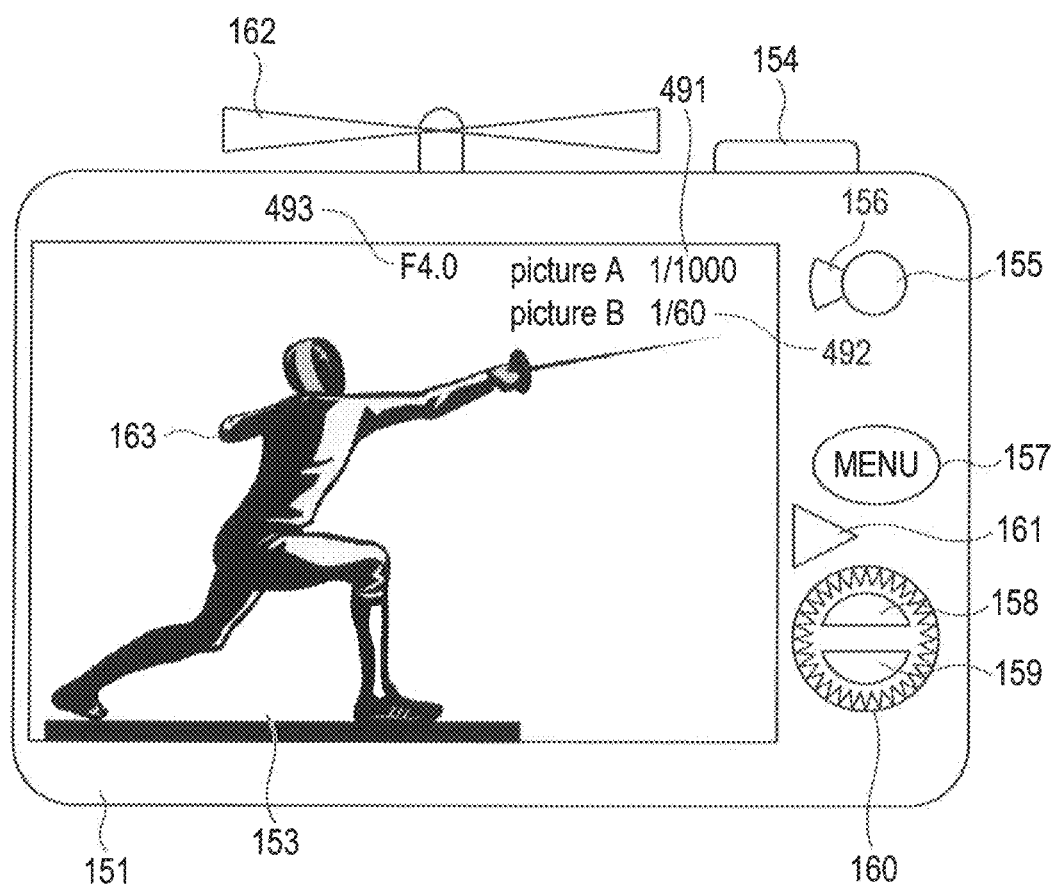
FIG. 20 is a diagram illustrating a state of a display unit during live view display after the imaging device is powered up.

FIG. 20 is a diagram illustrating a state of the display unit 153 during live view display after the imaging device 100 is powered up. A sports scene of a person 163 captured through the imaging optical system 152 is displayed on the display unit 153. Further, since the shooting mode selecting lever 156 is placed in a position turned 90 degrees clockwise from the state in FIG. 1B, shutter speeds 491, 492 of the "picture A" and the "picture B," and an F-number 493 in the dual image mode are displayed.

Figure 21A:
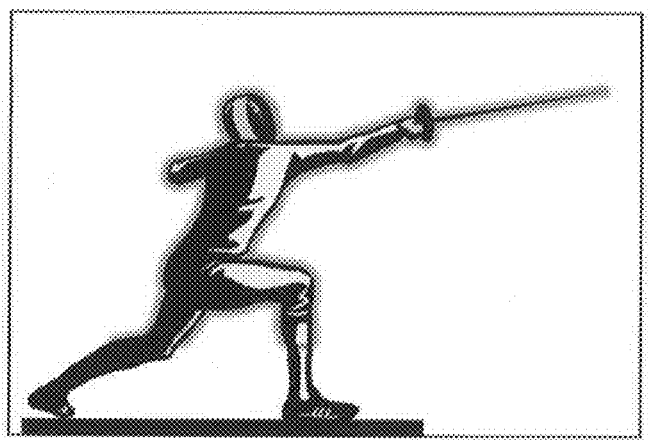
FIG. 21A and FIG. 21B are diagrams illustrating one frame among images acquired by operating a switch ST and a switch MV.
Figure 21B:
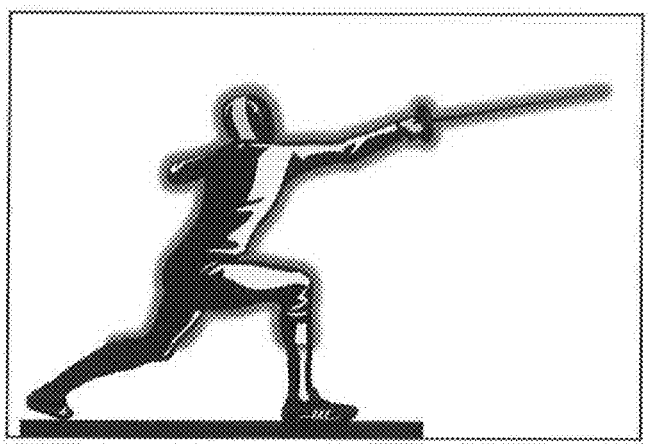

FIG. 21A and FIG. 21B illustrate one frame among images acquired by operating the switch ST 154 and the switch MV 155, respectively. FIG. 21A illustrates the "picture A" shot with a shutter speed of 1/1000 second and an aperture value of F4.0. FIG. 21B illustrate the "picture B" shot with a shutter speed 1/60 second and an aperture value of F4.0. The image illustrated in FIG. 21B is blurred due to such a slow shutter speed that the motion of the object does not stop. However, if this image is playbacked as a moving image at a frame rate of about 60 fps, this blur will work rather well, leading to a smooth high-definition image with less jerkiness. On the other hand, the stop motion effect is supposed to be seen in the image illustrated in FIG. 21A because the shutter speed is fast. However, as previously described with reference to FIG. 14, signal charge generated inside the silicon substrate leaks into adjacent pixel elements by diffusion to result in a blurred image as if the image illustrated in FIG. 21B is added. This crosstalk phenomenon also occurs in the image illustrated in FIG. 21B, but it is barely noticeable because the image is originally blurred.

Therefore, in the imaging device according to the present embodiment, a crosstalk correction is applied to an image signal output from the imaging element 184 in order to obtain the original stop motion effect at a fast shutter speed.

Figure 22:
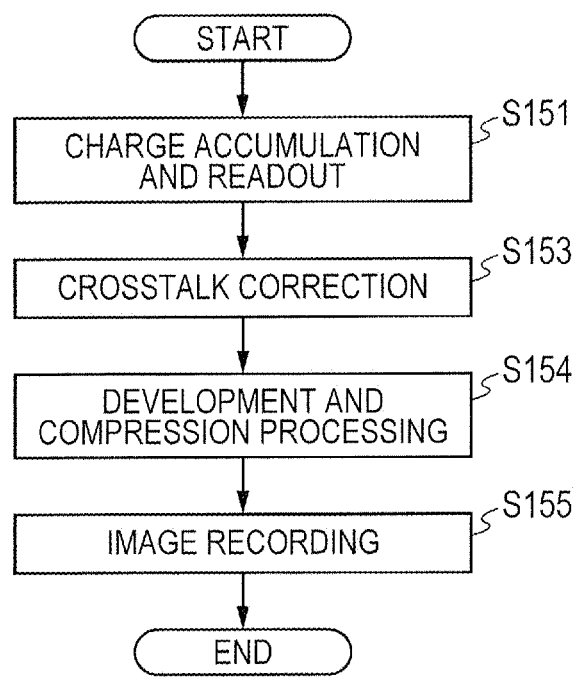
FIG. 22 is a flowchart illustrating a series of processing procedure steps including crosstalk correction.

FIG. 22 is a flowchart illustrating a series of processing procedure steps including the crosstalk correction. Processing from imaging to recording in the imaging device 100 according to the present embodiment is performed, for example, in step S151 to step S155 illustrated in FIG. 22.

In step S151, the accumulation of signal charge and readout of the signal charge to the photodiodes 310A, 310B are performed according to the sequence described with reference to FIG. 12 in response to the operation of the switch MV 155.

In step S153, a correction (crosstalk correction) to reduce crosstalk caused by the leakage of signal charge generated inside the silicon substrate into adjacent pixel elements is performed. The crosstalk correction is performed in the digital signal processing unit 187. In other words, the digital signal processing unit 187 functions as a crosstalk correction unit.

In step S154, development processing and compression processing as needed are performed. In the development processing, a gamma correction is performed as one of a series of processing steps. The gamma correction is processing to apply a gamma function to an input light amount distribution. As a result, the linearity of the output with respect to the input light amount distribution is not kept, and the crosstalk ratio also varies with the light amount at the time. Therefore, as illustrated in FIGS. 21A and 21B, it is desired to perform the crosstalk correction in a stage prior to step S154. When the crosstalk correction is performed after the development, the crosstalk processing may be changed depending on the magnitude of the light amount, or the crosstalk correction may be performed after the image signal is subjected to inverse gamma correction.

In step S155, images are recorded onto the recording medium 193. Instead of or in addition to recording on the recording medium 193, the images may also be stored in a recording device on a network via the radio interface unit 198.

Figure 23:
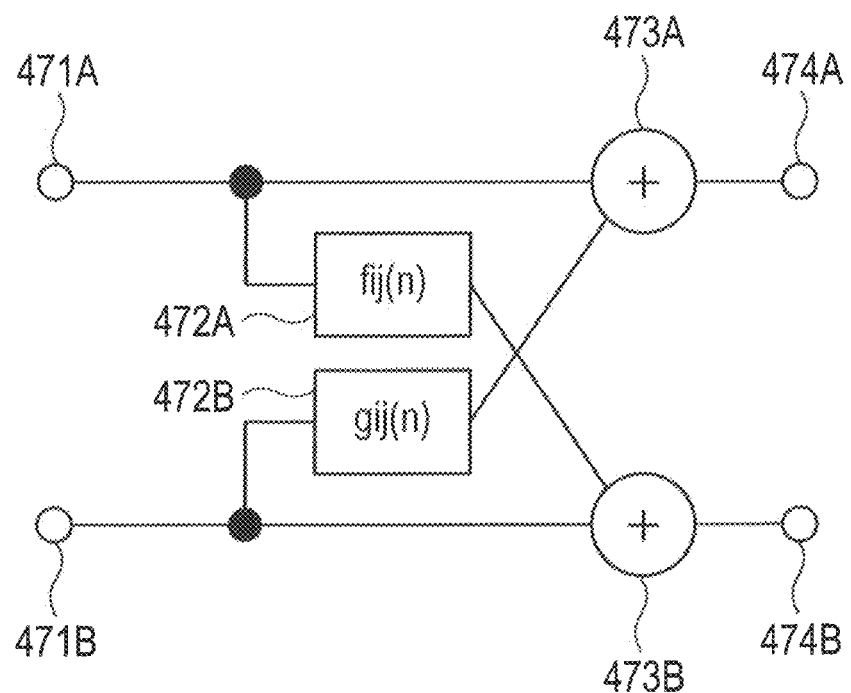
FIG. 23 is a diagram for describing crosstalk correction processing performed in a digital signal processing unit.

FIG. 23 is a diagram for describing the crosstalk correction processing performed in step S153 by the digital signal processing units 187. Actual processing is performed as digital signal processing.

In the digital signal processing unit 187, a signal 471A after being subjected to A/D conversion processing is input to a crosstalk amount correcting part 473A, and further input to a crosstalk amount correcting part 473B via a crosstalk amount calculating part 472A. Similarly, in the digital signal processing unit 188, a signal 471B after being subjected to A/D conversion processing is input to the crosstalk amount correcting part 473B, and further input to the crosstalk amount correcting part 473A via a crosstalk amount calculating part 472B.

In the crosstalk amount correcting part 473A, a crosstalk correction is performed on the signal 471A based on the signal 471A and the signal 471B after being subjected to a predetermined calculation by a crosstalk correction function $gij(n)$ in the crosstalk amount calculating part 472B to obtain an output signal 474A. The output signal 474A is subjected to development and/or compression processing as a subsequent processing step in the digital signal processing unit 187.

In the crosstalk amount correcting part 473B, a crosstalk correction is performed on the signal 471B based on the signal 471B and the signal 471A after being subjected to a predetermined calculation by a crosstalk correction function $fij(n)$ in the crosstalk amount calculating part 472A to obtain an output signal 474B. The output signal 474B is subjected to development and/or compression processing as a subsequent processing step in the digital signal processing unit 188.

Since the crosstalk depends on the amount of generated signal charge, the crosstalk amount correcting parts 473A, 473B can perform crosstalk corrections in a manner to correct an output signal of one pixel element by a crosstalk amount corresponding to the amount of signal charge generated in the other pixel element. This can remove, from the output signal of the one pixel element, a crosstalk component from the other pixel element, which is superimposed on the output signal.

Here, data at a pixel address ij of the n-th frame of "picture A" are denoted as $DATA\_Aij(n)$, data at a pixel address ij of the n-th frame of "picture B" is denoted as $DATA\_Bij(n)$, and a correction coefficient is denoted as $\alpha$. Since the crosstalk depends on the input light amount, corrected data $C\_DATA\_Aij(n)$ at a pixel address ij of the n-th frame of "picture A" can be expressed as Equation (4).

$$C\_DATA\_Aij(n)=DATA\_Aij(n)-\alpha \times DATA\_Bij(n) \quad (4)$$

When a crosstalk correction function $fij(n)$ is $$fij(n)=-\alpha \times DATA\_Bij(n),$$

Equation (4) can be expressed as follows:

$$C\_DATA\_Aij(n)=DATA\_Aij(n)+fij(n).$$

Similarly, corrected data $C\_DATA\_Bij(n)$ at a pixel address ij of the n-th frame of "picture B" can be expressed as Equation (5) with the correction coefficient denoted as $\beta$.

$$C\_DATA\_Bij(n)=DATA\_Bij(n)-\beta \times DATA\_Aij(n) \quad (5)$$

When a crosstalk correction function $gij(n)$ is $$gij(n)=-\beta \times DATA\_Aij(n),$$

Equation (5) can be expressed as follows:

$$C\_DATA\_Bij(n)=DATA\_Bij(n)+gij(n) \quad (6).$$

As mentioned above, although crosstalk also occurs in the "picture B," since it is barely noticeable because the image is originally blurred, processing expressed in Equation (5) and Equation (6) may be omitted. If the crosstalk correction is performed on an image with a relatively short accumulation time without performing the crosstalk correction on an image with a relatively long accumulation time, the calculation load can be reduced.

Figure 24:
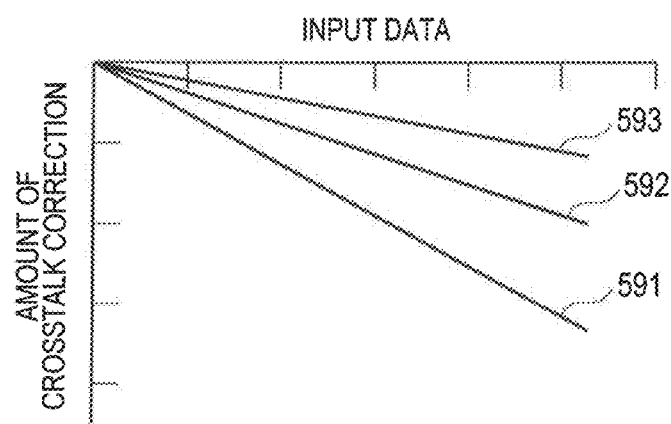
FIG. 24 is a graph illustrating a specific example of crosstalk correction functions.

FIG. 24 is a graph illustrating a specific example of the crosstalk correction functions $fij(n)$, $gij(n)$. In FIG. 24, the abscissa indicates the size of input data, and the ordinate indicates crosstalk correction amount to be corrected. Both of the crosstalk correction functions $fij(n)$, $gij(n)$ are functions to obtain crosstalk correction amounts proportional to the input data, respectively. Although both are different depending on the pixel structure in a precise sense, the correction coefficient $\alpha$ and the correction coefficient $\beta$ are nearly equal numeric values. However, the degree of leakage of signal charge, generated inside the silicon substrate depending on the incident angle of light on each pixel element, into adjacent pixel elements by diffusion is different. Therefore, the more the aperture 181 is opened to increase the F-number, the larger the crosstalk and hence the larger the absolute value of the crosstalk correction amount. On the other hand, the more the aperture 181 is narrowed to decrease the F-number, the smaller the crosstalk and hence the smaller the absolute value of the crosstalk correction amount. In FIG. 24, a characteristic 591 is a crosstalk correction function at F2.8, a characteristic 592 is a crosstalk correction function at F5.6, and a characteristic 593 is a crosstalk correction function at F11. The gradients of the characteristic 591, the characteristic 592, and the characteristic 593 become smaller in this order. Note that the F-number of the imaging optical system 152 can be continuously changed. Therefore, if the correction coefficient $\alpha$ and the correction coefficient β are set as F-number functions, more precise crosstalk corrections can be achieved.

Further, each of the correction coefficient α and the correction coefficient β can be set as a function of the accumulation time of a photodiode for "picture A" set to be relatively short. The crosstalk correction amount can also be changed depending on the image height to achieve a further more accurate crosstalk correction. Since crosstalk increases when light enters the light guide 255 obliquely, distance ZK from the optical axis 180 to each pixel may be calculated based on the pixel address ij to apply a crosstalk correction so as to increase the absolute value in proportion to the distance ZK. Further, since the change in incident angle of light on the light guide 255 depends also on distance HK between an exit pupil of the imaging optical system 152 and the imaging element 184, the crosstalk correction function can be set as a function of the distance HK to perform a more precise correction.

Figure 25:
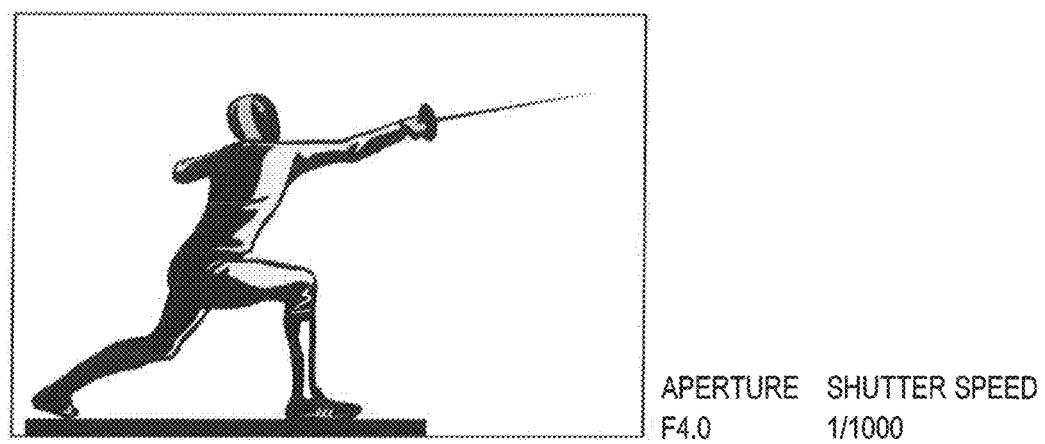
FIG. 25 is a diagram illustrating an example of an image after being subjected to crosstalk correction.
Figure 26:
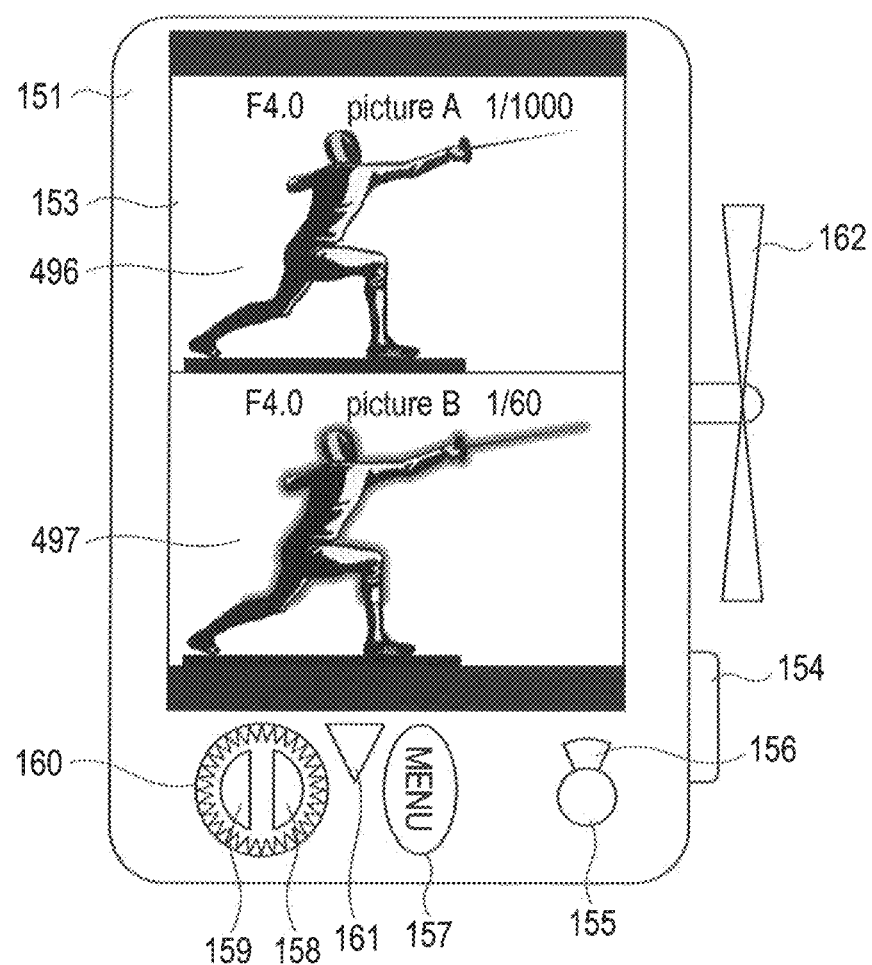
FIG. 26 is a diagram illustrating a state of displaying "picture A" and "picture B" next to each other on a display unit.

FIG. 25 illustrates an image of "picture A" after the image of "picture A" (FIG. 21A) shot with a shutter speed of 1/1000 and an aperture value of F4.0 is subjected to a crosstalk correction. In the image of FIG. 21A, signal charge generated inside the silicon substrate leaks into adjacent pixel elements by diffusion to result in a blurred image as if the image illustrated in FIG. 21B were added. On the other hand, in the image of FIG. 25, the original stop motion effect by the fast shutter speed is achieved. On the display unit 153 of the digital still motion camera, it is desired to be able to display both "picture A" 496 and "picture B" 497 side by side or up and down as illustrated in FIG. 26 when the playback button 161 is operated. Thus, the images can be compared to check on the level of the stop motion effect. This processing may also be performed in such a manner that image data are supplied to a system or an apparatus through a network to cause the system or a computer of the apparatus to read and execute a program.

Figure 27:
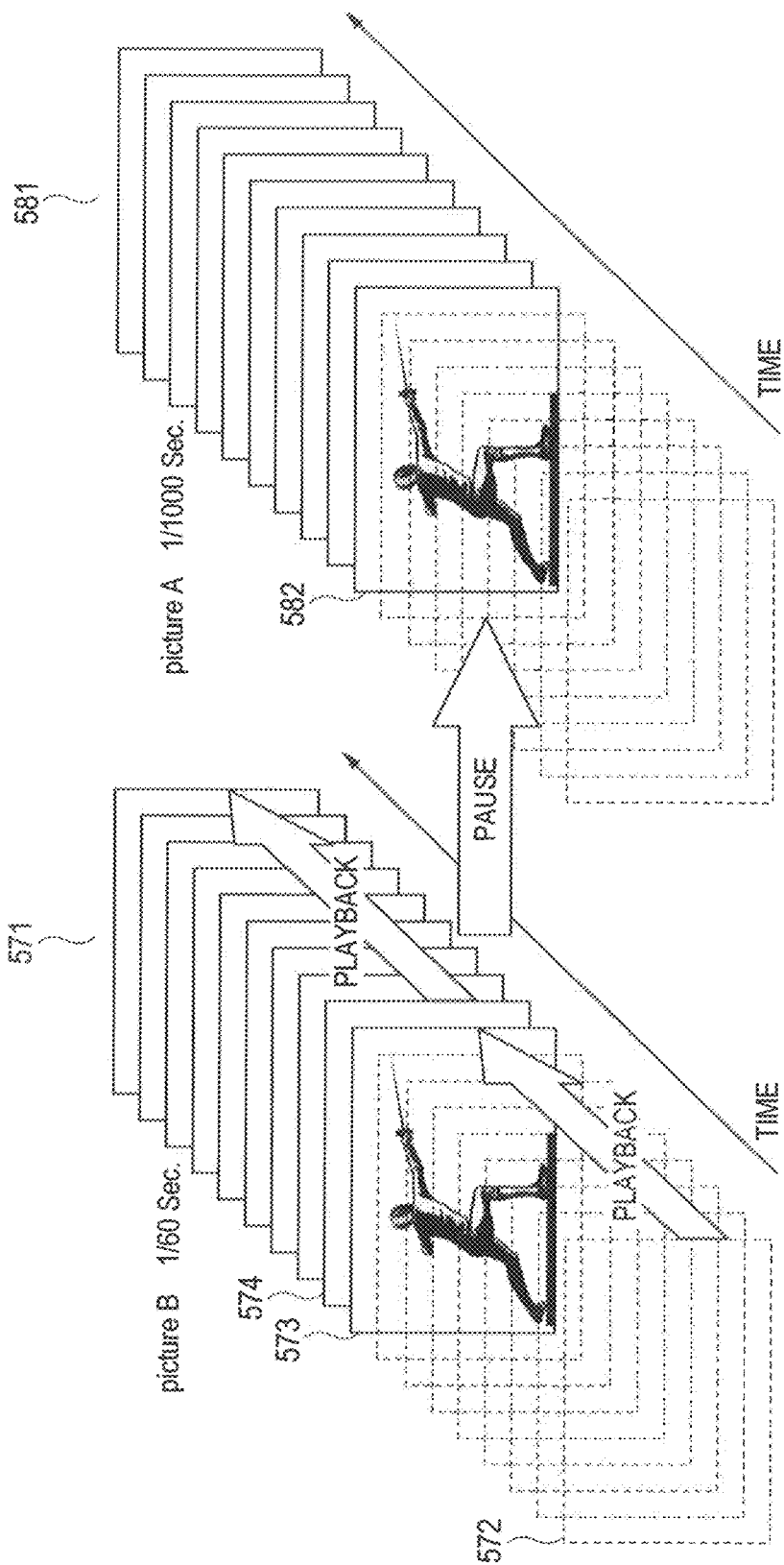
FIG. 27 is a diagram for describing an example of use of "picture A" and "picture B" stored in a storage.

FIG. 27 is a diagram for describing an example of use of the "picture A" and "picture B" stored in a storage of a tablet terminal, a personal computer, a TV monitor, or the like.

It is assumed that data files of "picture A" and "picture B" are stored in a storage on a network. In FIG. 27, a frame group 581 is a frame group of "picture A" stored in an MP4 file, and a frame group 571 is a frame group of "picture B" stored in another MP4 file. The same CLIP-UMID is set for these MP4 files to associate the MP4 files at the time of shooting.

First, when the playback of a moving image is started, frames are playbacked sequentially from a head frame 572 of the frame group 571 of "picture B" at a predetermined frame rate. Since the "picture B" is shot in such a setting that the shutter speed is not excessively fast (1/60 second in this example), the image playbacked is a high-definition image with less jerkiness.

Suppose here that a user gives an instruction to change the playback mode while a moving image of "picture B" is being presented. For example, when the user pauses the playback at the time where the playback progresses up to a frame 573, a frame 582 with the same time code is automatically retrieved from the data file of the "picture A" associated with the "picture B," and the frame 582 is displayed. The "picture A" is shot with a fast shutter speed (1/1000 second in this example) at which the stop motion effect can be easily obtained, i.e., the "picture A" is a powerful image obtained by shooting a moment of the sports scene. Although the two images of the "picture A" and the "picture B" are shot in different accumulation time settings, similar levels of signal charge are obtained in the imaging element 184, rather than performing the gain-up on the "picture A." Therefore, both the "picture A" and the "picture B" become noiseless images having excellent S/N ratios.

Here, when printing is instructed, data on the frame 582 of the "picture A" are output to the printer 195 via the print interface unit 194. Thus, the print also become powerful one having the stop motion effect that reflects the "picture A."

When the user releases the pause, the procedure automatically returns to the frame group 571 of the "picture B" to resume playback from a frame 574. At this time, the image to be playbacked is a high-definition image with less jerkiness.

Thus, according to the present embodiment, when two or more images based on signals different in accumulation period are shot at the same time using one imaging element, these images can be read out without sacrificing the frame rate.

[Second Embodiment]

An imaging device according to a second embodiment of the present invention will be described with reference to FIG. 28 to FIG. 30. The same constituent elements as those of the imaging device according to the first embodiment illustrated in FIG. 1A to FIG. 27 are given the same reference numerals to omit or simplify the description.

In the first embodiment, the two photodiodes 310A, 310B different in light-receiving efficiency (sensitivity) are used depending on the accumulation time to enable image shooting suitable for various shooting scenes. In the present embodiment, an example of controlling the accumulation time of one photodiode to achieve the same effect as that of the first embodiment will be described.

The imaging device according to the present embodiment is the same as the imaging device according to the first embodiment except that the circuit configuration of the pixels 303 of the imaging element 184 is different.

Figure 28:
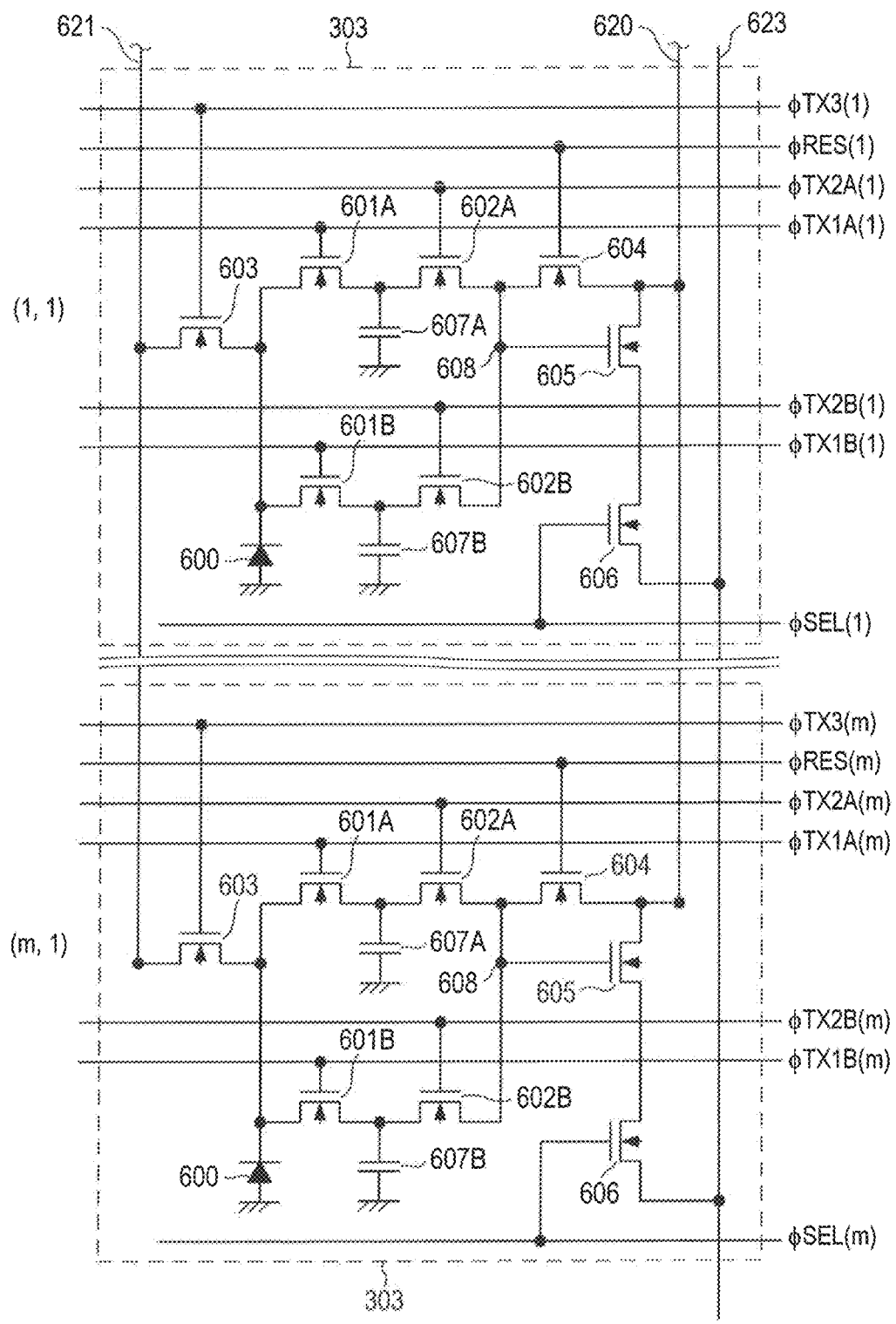
FIG. 28 is a circuit diagram illustrating a configuration example of pixels of an imaging element of an imaging device according to a second embodiment of the present invention.

FIG. 28 is a circuit diagram illustrating a circuit configuration of the pixels 303 of the imaging element 184 of the imaging device according to the present embodiment. FIG. 28 illustrates a pixel 303 in the first column and the first row, and a pixel 303 in the first column and the m-th row among the plurality of pixels 303 that constitute the pixel array 302. As illustrated in FIG. 28, each pixel 303 includes a photodiode 600, transfer transistors 601A, 601B, 602A, 602B, and 603, a reset transistor 604, an amplifier transistor 605, and a select transistor 606.

The anode of the photodiode 600 is connected to the ground line. The cathode of the photodiode 600 is connected to the source of the transfer transistor 601A, the source of the transfer transistor 601B, and the source of the transfer transistor 603, respectively. The drain of the transfer transistor 601A is connected to the source of the transfer transistor 602A. A connection node between the drain of the transfer transistor 601A and the source of the transfer transistor 602A forms a signal holding unit 607A. The drain of the transfer transistor 601B is connected to the source of the transfer transistor 602B. A connection node between the drain of the transfer transistor 601B and the source of the transfer transistor 602B forms a signal holding unit 607B.

The drain of the transfer transistor 602A and the drain of the transfer transistor 602B are connected to the source of the reset transistor 604 and the gate of the amplifier transistor 605. A connection node of the drain of the transfer transistor 602A, the drain of the transfer transistor 602B, the source of the reset transistor 604, and the gate of the amplifier transistor 605 forms a floating diffusion region 608. The source of the amplifier transistor 605 is connected to the drain of the select transistor 606. The drain of the reset transistor 604 and the drain of the amplifier transistor 605 are connected to a power source line 620. The drain of the transfer transistor 603 is connected to a power source line 621. The source of the select transistor 606 is connected to a signal output line 623.

Thus, each pixel 303 of the imaging element 184 of the imaging device according to the present embodiment includes two signal holding units 607A, 607B for one photodiode 600. Since the basic structure of a CMOS type imaging element having signal holding units is disclosed, for example, in Japanese Patent Application Laid-Open No. 2013-172210 by the applicant of the present application, detailed description thereof will be omitted here.

The plurality of pixels 303 of the pixel array 302 are connected in units of rows to control lines arranged in the row direction from the vertical scanning circuit 307. The control lines in each row include a plurality of control lines connected to the gates of the transfer transistors 601A, 602A, 601B, 602B, and 603, the reset transistor 604, and the select transistor 606, respectively. The transfer transistor 601A is controlled by a transfer pulse ϕTX1A, and the transfer transistor 602A is controlled by a transfer pulse ϕTX2A. The transfer transistor 601B is controlled by a transfer pulse ϕTX1B, and the transfer transistor 602B is controlled by a transfer pulse ϕTX2B. The reset transistor 604 is controlled by a reset pulse ϕRES, and the select transistor 606 is controlled by a select pulse ϕSEL. The transfer transistor 603 is controlled by a transfer pulse ϕTX3. Each control pulse is sent out from the vertical scanning circuit 307, not illustrated, based on the control signal from the system control CPU 178 of the imaging device. Each transistor is on-state when the control pulse is at the high level, and off-state when the control pulse is at the low level.

The imaging element 184 that forms part of the imaging device of the present embodiment includes the two signal holding units 607A, 607B for one photodiode 600. This enables a still image as a first image signal and a moving image as a second image signal to be shot at the same time. Therefore, two image signals different in accumulation period can be read out without reducing the S/N ratios.

Figure 29:
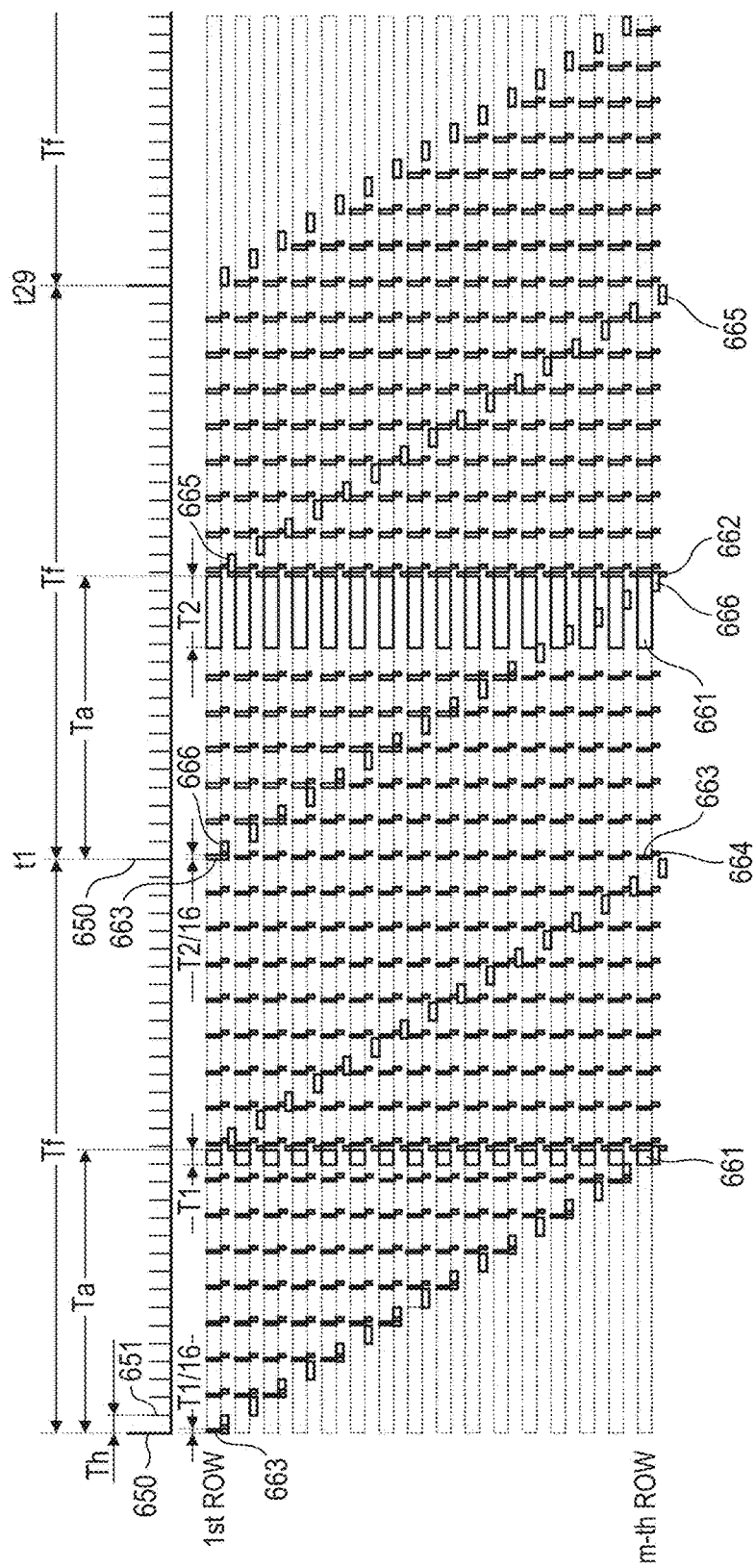
FIG. 29 is a chart for describing a method of driving the imaging element of the imaging device according to the second embodiment of the present invention.

FIG. 29 is a chart for describing the accumulation and readout timings of the imaging element 184 in the imaging device of the present embodiment when a still image as a first image signal and a moving image as a second image signal are shot at the same time. The term "accumulation" here means operation for transferring and accumulating charge generated in the photodiode 600 to and in the signal holding units 607A, 607B. The term "readout" means operation for outputting signals based on the charges, held in the signal holding units 607A, 607B, to the outside of the imaging element 184 via the floating diffusion region 608.

In FIG. 29, the abscissa is expressed in time to illustrate a vertical synchronization signal 650, a horizontal synchronization signal 651, a still image accumulation period 661, a still image transfer period 662, a still image readout period 665, a moving image accumulation period 663, a moving image transfer period 664, and a moving image readout period 666. Here, the still image accumulation period 661 indicates an accumulation period of signal charge for the still image into the photodiode 600. The still image transfer period 662 indicates a period of transferring the signal charge for the still image from the photodiode 600 to the signal holding unit 607. The still image readout period 665 indicates a readout period of the still image. The moving image accumulation period 663 indicates an accumulation period of signal charge for the moving image into the photodiode 600. The moving image transfer period 664 indicates a period of transferring the signal charge for the moving image from the photodiode 600 to the signal holding unit 607. The moving image readout period 666 indicates a readout period of the moving image.

In this driving example, the still image and the moving image are read out during each cycle of the vertical synchronization signal 650. Further, timings of 16 rows are illustrated in FIG. 29 for descriptive purposes, but the actual imaging element 184 has thousands of rows. In FIG. 29, the final row is the m-th row.

The still image as the first image signal is generated based on signal charge generated during one accumulation period (still image accumulation period 661) performed simultaneously in all rows during each cycle (time Tf) of the vertical synchronization signal 650. The moving image as the second image signal is generated based on signal charge obtained by adding up signal charges respectively generated during accumulation periods (moving image accumulation periods 663) divided by the number of Np times (where Np is an integer of 2 or more (Np>1)). In the present embodiment, Np as the number of accumulation periods of the moving image as the second image signal performed during one shooting cycle is, for example, 16 times, and these accumulation periods are performed at equal time intervals. The interval Tf (time Tf) of the vertical synchronization signal 650 corresponds to the frame rate of the moving image, for example, 1/60 second in the present embodiment.

This enables simultaneous shooting of the moving image and the still image. Further, an image having no blur at a short accumulation time intended by the person who performs shooting can be acquired as the still image while a smooth image with less jerkiness can be acquired as the moving image.

In the first shooting cycle (Tf) illustrated in FIG. 29, the accumulation time of the still image (still image accumulation period 661) is set to a time corresponding to the shutter speed T1 set by the person who performs shooting. In this driving example, the shutter speed T1 is 1/2000 second. The accumulation period of the still image is the same in all rows, which is set to be completed immediately before the start of the readout of the first row of the still image (still image readout period 665). The end time of the accumulation period of the still image is a time after a lapse of time Ta from the vertical synchronization signal 650. The time Ta is set to be half or less of the interval Tf of the vertical synchronization signal 650. Since the end time of the accumulation period of the still image (still image accumulation period 661) is the same in all rows, the start time of the accumulation period of the still image with respect to the vertical synchronization signal 650 is set according to the shutter speed T1 of the still image. The readout of the still image as the first image signal (still image readout period 665) is performed during the accumulation period of the moving image as the second image signal (moving image accumulation period 663).

On the other hand, the accumulation period of the moving image (moving image accumulation period 663) is performed plural times at equal time intervals during each cycle. In this driving example, the time interval is set to complete the accumulation period divided into 16 times immediately before the start of the readout of each row (moving image readout period 666). The time interval of the accumulation period of the moving image may be set to be a multiple of an integer for the interval Th of the horizontal synchronization signal 651. Thus, the accumulation timing of each row of the moving image is the same as that in the other rows. In FIG. 29, the time interval of the accumulation period of the moving image is illustrated to be twice the interval Th of the horizontal synchronization signal 651 for descriptive purposes. When the number of rows of the imaging element 184 is denoted by m, and the number of accumulation periods of the moving image during each cycle is denoted by Np, the time interval of the accumulation period of the moving image is generally set to a value obtained by multiplying an integer not exceeding m/Np by the interval Th of the horizontal synchronization signal 651.

Further, one accumulation time of the moving image is set to T1/Np (=$\frac{1}{32000}$ second). The start time of the accumulation period of the moving image in each row is fixed with respect to the vertical synchronization signal 650. The end time of one accumulation period of the moving image is set with respect to the vertical synchronization signal 650 depending on the still image shutter speed T1 set by the person who performs shooting.

On the other hand, an example in which the person who performs shooting sets a long shutter speed T2 for the still image when the brightness of an object is low (e.g., T2=$\frac{1}{500}$ second) corresponds to a second shooting cycle (Tf) starting at time t1 in FIG. 29.

As described in the first shooting cycle, the end time of the accumulation period of the still image is the same in all rows (time after the lapse of time Ta from the vertical synchronization signal 650), and set to be completed immediately before the start of the readout of the first row of the still image (still image readout period 665). Since the end time of the accumulation period of the still image is the same in all rows, the start time of the accumulation period of the still image is set with respect to the vertical synchronization signal 650 depending on the shutter speed T1 for the still image. The readout of the still image as the first image signal (still image readout period 665) is performed during the accumulation period of the moving image as the second image signal (moving image accumulation period 663).

Like in the first shooting cycle, the accumulation period of the moving image is performed plural times at equal time intervals during each cycle. In this driving example, the time interval is set to complete the accumulation period divided into 16 times immediately before the start of the readout of each row (moving image readout period 666). The time interval of the accumulation period of the moving image may be set to be a multiple of an integer for the interval Th of the horizontal synchronization signal 651. Thus, the accumulation timing of each row of the moving image is the same as that in the other rows. Further, one accumulation time of the moving image is set to T2/Np (=$\frac{1}{8000}$ second). The start time of the accumulation period of the moving image in each row is fixed with respect to the vertical synchronization signal 650. The end time of one accumulation period of the moving image is set with respect to the vertical synchronization signal 650 depending on the still image shutter speed T2 set by the person who performs shooting.

Referring next to a timing chart of FIG. 30, an example of the control method for the imaging element 184 in a second hooting cycle starting at time t1 in FIG. 29 will be described. Time t1 at which a vertical synchronization signal φV rises in FIG. 30 is the same as time t1 at which the vertical synchronization signal 650 rises in FIG. 29.

It is assumed here that the imaging element 184 has m rows of pixels in the vertical direction. In FIG. 30, the timings of the first row and the m-th row as the final row are illustrated among the m rows. In FIG. 30, a signal φV is the vertical synchronization signal, and a signal φH is the horizontal synchronization signal.

First, at time t1, the vertical synchronization signal φV and the horizontal synchronization signal φH supplied from the timing generation unit 189 are changed from the low level to the high level.

Then, at time t2 synchronized with the change of the vertical synchronization signal φV to the high level, a reset pulse φRES(1) for the first row supplied from the vertical scanning circuit 307 is changed from the high level to the low level. This causes the reset transistor 604 of each pixel 303 in the first row to be turned off to release the reset state of the floating diffusion region 608. Simultaneously, a select pulse φSEL(1) for the first row supplied from the vertical scanning circuit 307 is changed from the low level to the high level. This causes the select transistor 606 of each pixel 303 in the first row to be turned on to enable the readout of an image signal from each pixel 303 in the first row.

Then, at time t3, a transfer pulse φTX2B(1) for the first row supplied from the vertical scanning circuit 307 is changed from the low level to the high level. This causes the transfer transistor 602B of each pixel 303 in the first row to be turned on to transfer, to the floating diffusion region 608, signal charge of the moving image accumulated in the signal holding unit 607B during the previous shooting cycle (a shooting cycle ending at time t1). As a result, a signal corresponding to a change in the potential of the floating diffusion region 608 is read out into the signal output line 623 via the amplifier transistor 605 and the select transistor 606. The signal read out into the signal output line 623 is supplied to an unillustrated readout circuit, and output to the outside as an image signal of the moving image of each pixel in the first row (corresponding to the moving image readout period 666 in FIG. 29).

Then, at time t4, a transfer pulse φTX2B(1) for the first row and transfer pulses φ(TX2A φTX2A(1), φTX2A(m)) for all rows supplied from the vertical scanning circuit 307 are changed from the low level to the high level. This causes the transfer transistor 602B of each pixel 303 in the first row and the transfer transistors 602A of the pixels 303 in all rows to be turned on. At this time, the reset pulses φRES (φRES(1), φRES(m)) in all rows are already changed to the high level, and hence the reset transistors 604 are in the on-state. Thus, the floating diffusion regions 608 of the pixels 303 in all rows, the signal holding units 607A of the pixels 303 in all rows, and the signal holding unit 607B of each pixel 303 in the first row are reset. At this time, the select pulse φSEL(1) in the first row is also changed to the low level, and each pixel 303 in the first row is returned to an unselected state.

Then, at time t5, transfer pulses φTX3 (φTX3(1), φTX3(m)) for all rows supplied from the vertical scanning circuit 307 are changed from the high level to the low level. This causes the transfer transistors 603 of the pixels 303 in all rows to be turned off to release the reset of the photodiodes 600 of the pixels 303. Then, the accumulation of signal charge of the moving image in the photodiodes 600 of the pixels 303 in all rows is started (corresponding to the moving image accumulation period 663 in FIG. 29).

Here, a time interval Tb between time t1, at which the vertical synchronization signal φV becomes the high level, and time t5, at which the accumulation of signal charge of the moving image in the photodiodes 600 of the pixels 303 in all rows is started, is fixed.

Figure 30:
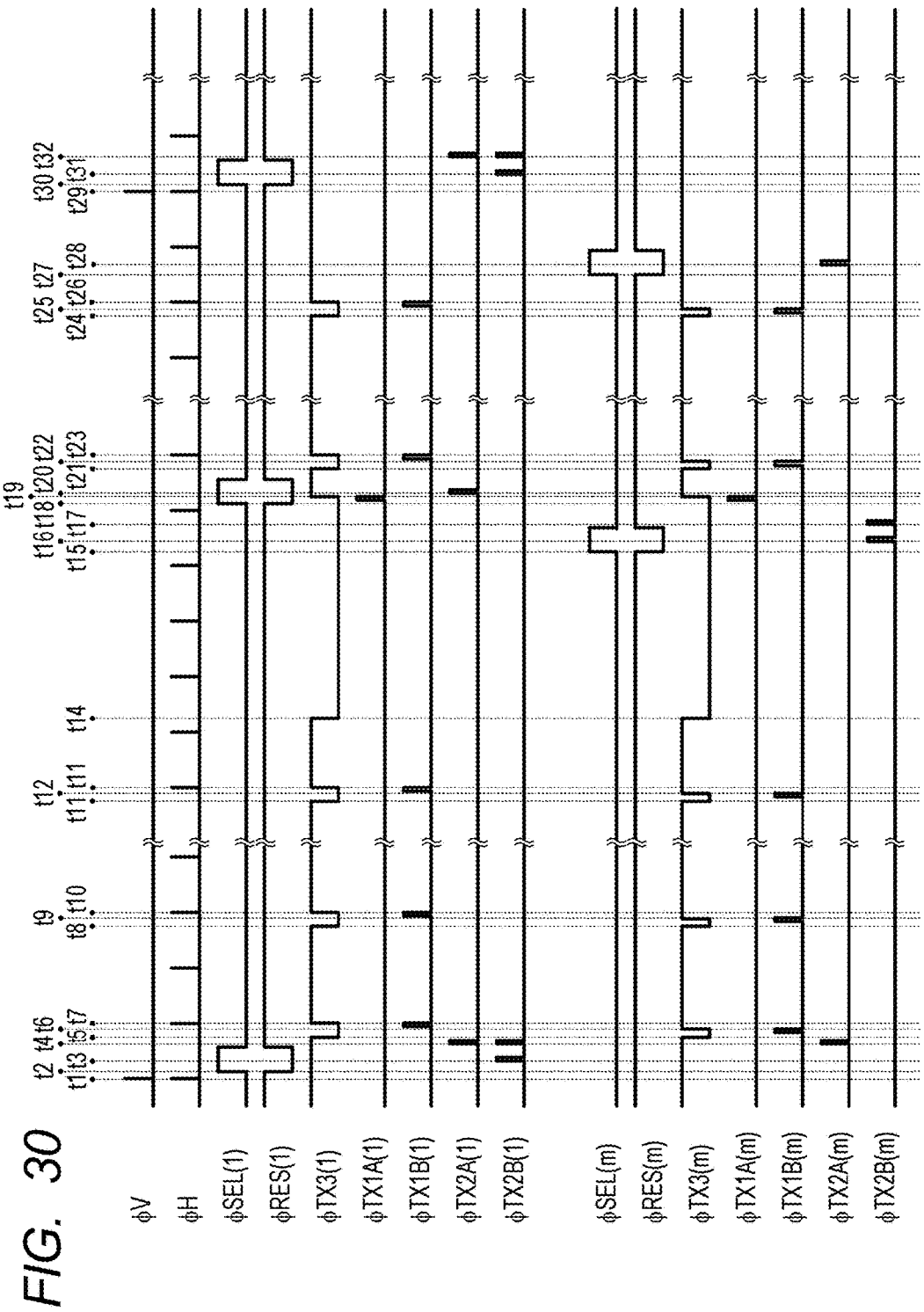
FIG. 30 is a timing chart illustrating a driving sequence of the imaging element of the imaging device according to the second embodiment of the present invention.

Note that the start of the accumulation period of the first row of the moving image at time t5 in FIG. 30 represents the start of the accumulation period of the moving image in the shooting cycle starting at time t1 in FIG. 29. Further, the start of the accumulation period of the m-th row of the moving image at time t5 represents the start of the accumulation period of the moving image in the shooting cycle ending at time t1 in FIG. 29.

In FIG. 29, the accumulation times of the still image and the moving image are different between the shooting cycle ending at time t1 and the shooting cycle starting at time t1. Since the accumulation time in the shooting cycle ending at time t1 is shorter than the accumulation time in the shooting cycle starting at time t1, the accumulation period of the m-th row of the moving image in the shooting cycle ending at time t1 is completed first.

Then, immediately before time t6, the transfer pulse φTX1B(m) for the m-th row is changed from the low level to the high level. This causes the transfer transistor 601B of each pixel 303 in the m-th row to be turned on to transfer, to the signal holding unit 607B, the signal charge accumulated in the photodiode 600 of the pixel 303 in the m-th row (corresponding to the moving image transfer period 664 in FIG. 29).

Then, at time t6, the transfer pulse φTX1B(m) for the m-th row is changed from the high level to the low level. This causes the transfer transistor 601B of the pixel 303 in the m-th row to be turned off to complete the transfer of the signal charge accumulated in the photodiode 600 to the signal holding unit 607B.

A period from time t5 to time t6 corresponds to the accumulation time (=T1/16) in each of the Np accumulation periods for the moving image in the shooting cycle ending at time t1 in FIG. 29.

Similarly, at time t6, the transfer pulse φTX3(m) for the m-th row is changed from the low level to the high level. This causes the transfer transistor 603 of each pixel 303 in the m-th row to be turned on to put the photodiode 600 of the pixel 303 in the m-th row into the reset state.

Then, immediately before time t7, the transfer pulse φTX1B(1) for the first row supplied from the vertical scanning circuit 307 is changed from the low level to the high level. This causes the transfer transistor 601B of each pixel 303 in the first row to be turned on to transfer, to the signal holding unit 607B, the signal charge accumulated in the photodiode 600 of the pixel 303 in the first row.

Then, at time t7, the transfer pulse φTX1B(1) for the first row is changed from the high level to the low level. This causes the transfer transistor 601B of the pixel 303 in the first row to be turned off to complete the transfer of the signal charge accumulated in the photodiode 600 of the pixel 303 in the first row to the signal holding unit 607B.

A period from time t5 to time t7 corresponds to the accumulation time (=T2/16) in each of the Np accumulation periods for the moving image in the shooting cycle starting at time t1 in FIG. 29.

Similarly, at time t7, the transfer pulse φTX3(1) for the first row is changed from the low level to the high level. This causes the transfer transistor 603 of the pixel 303 in the first row to be turned on to put the photodiode 600 of the pixel 303 in the first row into the reset state.

The second accumulation period of the moving image is started at time t8 after a lapse of the time twice the interval Th of the horizontal synchronization signal φH from time t5 at which the first accumulation period of the moving image in the shooting cycle starting at time t1 is started.

Since the operation of the second accumulation period of the moving image starting at time t8 and ending at time t10 is the same as the operation of the first accumulation period of the moving image starting at time t5 and ending at time t7 as mentioned above, the description thereof will be omitted.

Here, in the operation of the first and the second accumulation periods of the moving image, signal charges of the moving image generated during these two accumulation periods are added up and held in the signal holding unit 607B.

Then, during a period from time t10 to time t11, the third to fifth accumulation periods of the moving image are performed in the same manner as the period from time t5 to time t7 as mentioned above.

Then, the sixth accumulation period of the moving image is started at time t11. Here, the start time t11 of the sixth accumulation period of the moving image is set to the time after a lapse of the time T (6×2×Th+Tb) from time t1 at which the vertical synchronization signal φV becomes the high level. Here, Th denotes the time interval of the horizontal synchronization signal φH, and Tb denotes a time interval between time t1, at which the vertical synchronization signal φV becomes the high level, and time t5 at which the first accumulation period of the moving image is started in the photodiode 600.

Since the operation of the sixth accumulation period of the moving image starting at time t11 and ending at time t13 is the same as the operation of the first accumulation period of the moving image starting at time t5 and ending at time t7 as mentioned above, the description thereof will be omitted.

Then, the accumulation period of the still image as the first image signal is started at time t14. In this driving example, the number of accumulation periods of the still image in one shooting cycle is once. The start time of the readout period of the still image (corresponding to the still image readout period 665 in FIG. 29) with respect to the vertical synchronization signal φV is fixed. Therefore, the end time of the accumulation period of the still image with respect to the vertical synchronization signal φV is fixed to a time after a lapse of time Ta from the start time, and the accumulation period of the still image is set to be completed at time t19. When the shutter speed T2 of the still image is set by the person who performs shooting, the start time of the accumulation period of the still image is controlled in the imaging device of the present embodiment.

At time t14 back by time T2 from time t19 as the end time of the accumulation period of the still image, the transfer pulses φTX3 (φTX3(1), φTX3(m)) for all rows are changed from the high level to the low level. This causes the transfer transistors 603 of the pixels 303 in all rows to be turned off to release the reset of the photodiodes 600 of the pixels 303 in all rows. Then, the accumulation period of signal charge of the still image in the photodiodes 600 of the pixels 303 in all rows is started (corresponding to the still image accumulation period 661 in FIG. 29).

Further, during the accumulation period of signal charge of the still image, the readout period of the m-th row of the moving image in the previous shooting cycle that ends at time t1 is completed.

First, at time t15, the reset pulse φRES(m) for the m-th row supplied from the vertical scanning circuit 307 is changed from the high level to the low level. This causes the reset transistor 604 of each pixel 303 in the m-th row to be turned off to release the reset state of the floating diffusion region 608. Simultaneously, the select pulse φSEL(m) for the m-th row supplied from the vertical scanning circuit 307 is changed from the low level to the high level. This causes the select transistor 606 of the pixel 303 in the m-th row to be turned on to enable the readout of the image signal from the pixel 303 in the m-th row.

Then, at time t16, the transfer pulse ϕTX2B(m) for the m-th row is changed from the low level to the high level. This causes the transfer transistor 602B of the pixel 303 in the m-th row to be turned on to transfer, to the floating diffusion region 608, the signal charge of the moving image accumulated in the signal holding unit 607B during the previous shooting cycle that ends at time t1. As a result, a signal corresponding to a change in the potential of the floating diffusion region 608 is read out into the signal output line 623 via the amplifier transistor 605 and the select transistor 606. The signal read out into the signal output line 623 is supplied to an unillustrated readout circuit, and output to the outside as an image signal of the moving image in the m-th row (corresponding to the moving image readout period 666 in FIG. 29).

Thus, the readout of the moving image as the second image signal in the previous shooting cycle that ends at time t1 is completed. Next, the readout of the still image as the first image signal in the shooting cycle that starts at time t1 is performed (corresponding to the still image readout period 665 in FIG. 29).

Then, at time t17, the transfer pulse ϕTX2B(m) for the m-th row is changed from the low level to the high level. This causes the transfer transistor 602B of the pixel 303 in the m-th row to be turned on. At this time, the reset pulse ϕRES(m) in the m-th row is already changed to the high level, and hence the reset transistor 604 is in the on-state. Thus, the floating diffusion region 608 of each pixel 303 in the m-th row, and the signal holding unit 607B of each pixel 303 in the m-th row are reset. At this time, the select pulse ϕSEL (m) in the m-th row is also changed to the low level, and each pixel 303 in the m-th row is returned to the unselected state.

Then, at time t18, the reset pulse ϕRES(1) for the first row is changed from the high level to the low level. This causes the reset transistor 604 of each pixel 303 in the first row to be turned off to release the reset of the floating diffusion region 608. Simultaneously, the select pulse ϕSEL(1) for the first row is changed from the low level to the high level. This causes the select transistor 606 of the pixel 303 in the first row to be turned on to enable the readout of an image signal from the pixel 303 in the first row.

Then, immediately before t19, the transfer pulses ϕTX1A (ϕTX1A(1), ϕTX1A(m)) for all rows supplied from the vertical scanning circuit 307 are changed from the low level to the high level. This causes the transfer transistors 601A of the pixels 303 in all rows to be turned on to transfer, to the signal holding units 607A, the signal charges accumulated in the photodiodes 600 of the pixels 303 in all rows (corresponding to the still image transfer period 662 in FIG. 29).

Then, at time t19, the transfer pulses ϕTX1A (ϕTX1A(1), ϕTX1A(m)) for all rows are changed from the high level to the low level. This causes the transfer transistors 601A of the pixels 303 in all rows to be turned off to complete the transfer of the signal charges accumulated in the photodiodes 600 of the pixels 303 in all rows to the signal holding units 607A.

A period from time t14 to time t19 corresponds to the accumulation time T2 of the still image in the shooting cycle that starts at time t1.

Then, at time t20, the transfer pulse ϕTX2A(1) for the first row is changed from the low level to the high level. This causes the transfer transistor 602A of each pixel 303 in the first row to be turned on to transfer, to the floating diffusion region 608, the signal charge accumulated in the signal holding unit 607A of the pixel 303 in the first row. As a result, a signal corresponding to a change in the potential of the floating diffusion region 608 is read out into the signal output line 623 via the amplifier transistor 605 and the select transistor 606 of the pixel 303 in the first row. The signal read out into the signal output line 623 is supplied to an unillustrated readout circuit, and output to the outside as an image signal of the still image in the first row (corresponding to the still image readout period 665 in FIG. 29). Thus, the image signal of the still image in the first row as the first image signal is read out during the accumulation period (between time t5 to time t26) of the image signal of the moving image in the first row as the second image signal.

Then, the seventh accumulation period of the moving image is started at time t21. Here, the start time t21 of the seventh accumulation period of the moving image is set to a time after a lapse of time T ((7+2)×2×Th+Tb) from time t1 at which the vertical synchronization signal ϕV becomes the high level. In this driving example, two accumulation periods of the moving image overlap the accumulation period of the still image (corresponding to the still image accumulation period 661 in FIG. 29). Therefore, the start time t21 of the seventh accumulation period of the moving image is equivalent to the start time of the ninth accumulation period of the moving image in the shooting cycle that starts at time t1.

Since the operation of the seventh accumulation period of the moving image starting at time t21 and ending at time t23 is the same as the operation of the first accumulation period of the moving image starting at time t5 and ending at time t7 as mentioned above, the description thereof will be omitted.

Then, during a period from time t23 to time t24, the eighth to thirteenth accumulation periods of the moving image are performed in the same manner as the period from time t5 to time t7 as mentioned above.

Then, the final fourteenth accumulation period of the moving image in the shooting cycle that starts at time t1 is started at time t24. Here, the start time t24 of the fourteenth accumulation period of the moving image is set to a time after a lapse of time T ((14+2)×2×Th+Tb) from time t1 at which the vertical synchronization signal ϕV becomes the high level.

Since the operation of the fourteenth accumulation period of the moving image starting at time t24 and ending at time t26 is the same as the operation of the first accumulation period of the moving image starting at time t5 and ending at time t7 as mentioned above, the description thereof will be omitted.

Then, at time t27, the reset pulse ϕRES(m) for the m-th row is changed from the high level to the low level. This causes the reset transistor 604 of each pixel 303 in the m-th row to be turned off to release the reset state of the floating diffusion region 608. Simultaneously, the select pulse ϕSEL (m) for the m-th row is changed from the low level to the high level. This causes the select transistor 606 of each pixel 303 in the m-th row to be turned on to enable the readout of the image signal from the pixel 303 in the m-th row.

Then, at time t28, the transfer pulse ϕTX2A(m) for the m-th row is changed from the low level to the high level. This causes the transfer transistor 602A of each pixel 303 in the m-th row to be turned on to transfer, to the floating diffusion region 608, the signal charge of the still image accumulated in the signal holding unit 607A of the pixel 303 in the m-th row. As a result, a signal corresponding to a change in the potential of the floating diffusion region 608 is read out into the signal output line 623 via the amplifier transistor 605 and the select transistor 606 of the pixel 303 in the m-th row. The signal read out into the signal output line 623 is supplied to an unillustrated readout circuit, and output to the outside as an image signal of the still image in the m-th row (corresponding to the still image readout period 665 in FIG. 29). Thus, the image signal of the still image in the m-th row as the first image signal is read out during the accumulation period of the image signal of the moving image in the m-th row as the second image signal.

Then, at time t29, the vertical synchronization signal ϕV supplied from the timing generation unit 189 is changed from the low level to the high level to start the next shooting period.

As described above, in this driving example, the end time of the accumulation period of the still image is fixed with respect to the vertical synchronization signal, and the start time of the accumulation period of the moving image performed plural times in one shooting cycle is fixed with respect to the vertical synchronization signal. This enables the readout of the moving image and the still image in the same shooting cycle.

When the shutter speed T1 of the moving image is slower than a predetermined shutter speed Tth, a still image having no blur at a short accumulation time and a moving image with less jerkiness at a long accumulation period can be shot at the same time in one shooting cycle.

Thus, according to the present embodiment, when two or more images based on signals different in accumulation period are shot at the same time using one imaging element, these images can be read out without sacrificing the frame rate.

[Alternative Embodiments]

The present invention is not limited to the aforementioned exemplary embodiments, and various modifications can be made.

For example, the configuration of the imaging device described in the aforementioned embodiments is just an example, and the imaging device to which the present invention can be applied is not limited to the configuration illustrated in FIG. 1A to FIG. 2. Further, the circuit configuration of each unit of the imaging element is not limited to the configuration illustrated in FIG. 3, FIG. 8, FIG. 11, or FIG. 28.

For example, although the reset transistor 314, the amplifier transistor 315, and the select transistor 317 are shared between the two pixel elements 303A, 303B in the pixel circuit illustrated in FIG. 8, these transistors may be provided in the pixel elements 303A, 303B, respectively. Further, the number of pixel elements that constitute one pixel in the pixel circuit illustrated in FIG. 8 is not limited to two, and it may be three or more.

Further, in the sample hold circuit illustrated in FIG. 8, the capacitor for holding a pixel signal from the pixel element 303A and the capacitor for holding a pixel signal from the pixel element 303B are separated, but these capacitors may be shared.

Further, in the second embodiment mentioned above, the number of accumulation periods of the still image is one and the number of accumulation periods of the moving image is 16, but the numbers of these accumulation periods are not limited thereto because the numbers are selected properly depending on the shooting conditions and the like. For example, it is only necessary to perform the accumulation of the still image at least once, but it may be twice or more. Further, the number of accumulations of the moving image may be at least twice or more.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-027556, filed Feb. 17, 2016, and Japanese Patent Application No. 2016-244551, filed Dec. 16, 2016, which are hereby incorporated by reference herein in their entirety.

What is claimed is:

1. An imaging device comprising:
a plurality of pixels, each of the plurality of pixels including a first pixel element including a first photoelectric converter, and a second pixel element including a second photoelectric converter lower in sensitivity than the first photoelectric converter;
a readout circuit configured to read out, from the plurality of pixels, a first image signal based on signal charge generated in the first pixel element of each of the plurality of pixels during a first accumulation period, and a second image signal based on signal charge generated in the second pixel element of each of the plurality of pixels during a second accumulation period longer than the first accumulation period, the second image signal being synchronized with the first image signal; and
a controller configured to control the readout circuit so that a first readout period for reading out the first image signal is performed during the second accumulation period.

2. The imaging device according to claim 1, wherein the controller controls start timing of the first accumulation period to come after start timing of the second accumulation period, when a length of the first accumulation period is longer than a length of a second readout period for reading out the second image signal.

3. The imaging device according to claim 2, wherein the start timing of the first accumulation period is identical to the start timing of the second accumulation period.

4. The imaging device according to claim 1, wherein the controller controls end timing of the first accumulation period to come after end timing of the second readout period, when a length of the first accumulation period is shorter than or equal to a length of the second readout period for reading out the second image signal.

5. The imaging device according to claim 4, wherein the end timing of the first accumulation period is identical to the end timing of the second readout period.

6. The imaging device according to claim 2, wherein end timing of the first accumulation period is around a middle of the second accumulation period.

7. The imaging device according to claim 1, wherein the controller controls the readout circuit not to perform reading out of the first image signal, when a length of the first accumulation period is longer than half of the second accumulation period.

8. The imaging device according to claim 1, wherein the first accumulation period is set according to brightness of an object.

9. The imaging device according to claim 1, wherein the second accumulation period is fixed.

10. An imaging device comprising:
a plurality of pixels, each of the plurality of pixels including a photoelectric converter, and first and second memories;
a readout circuit configured to read out, from the plurality of pixels, a first image signal generated by transferring, at least once to the first memory, signal charge generated in the photoelectric converter in one shooting cycle, and a second image signal generated by transferring, at least twice or more to the second memory, and adding up signal charge generated in the photoelectric converter in the one shooting cycle, the second image signal being synchronized with the first image signal; and
a controller configured to control the readout circuit so that a readout period for reading out the first image signal is performed during an accumulation period of the second image signal.

11. The imaging device according to claim 10, wherein end timing of an accumulation period of the first image signal is around a middle of the accumulation period of the second image signal.

12. A method of driving an imaging device including an imaging element having a plurality of pixels, each of the plurality of pixels including a photoelectric converter, and first and second memories, the method comprising:
reading out, from the plurality of pixels, a first image signal generated by transferring, at least once to the first memory, signal charge generated in the photoelectric converter in one shooting cycle; and
reading out, from the plurality of pixels, a second image signal generated by transferring, at least twice or more to the second memory, and adding up signal charge generated in the photoelectric converter in the one shooting cycle, the second image signal being synchronized with the first image signal,
wherein the reading out the first image signal is performed during an accumulation period of the second image signal.

13. The imaging device according to claim 10, wherein the controller controls start timing of an accumulation period of the first image signal to come after start timing of the accumulation period of the second image signal, when a length of the accumulation period of the first image signal is longer than a length of a readout period for reading out the second image signal.

14. The imaging device according to claim 13, wherein the start timing of the accumulation period of the first image signal is identical to the start timing of the accumulation period of the second image signal.

15. The imaging device according to claim 10, wherein the controller controls end timing of an accumulation period of the first image signal to come after end timing of a readout period for reading out the second image signal, when a length of the accumulation period of the first image signal is shorter than or equal to a length of the readout period for reading out the second image signal.

16. The imaging device according to claim 15, wherein the end timing of the accumulation period of the first image signal is identical to the end timing of the readout period for reading out the second image signal.

17. The imaging device according to claim 10, wherein the controller controls the readout circuit not to perform reading out of the first image signal, when a length of an accumulation period of the first image signal is longer than half of the accumulation period of the second image signal.

18. The imaging device according to claim 10,
wherein an accumulation period of the first image signal is set according to brightness of an object.

19. The imaging device according to claim 10,
wherein the accumulation period of the second image signal is fixed.

20. An imaging device comprising:
a plurality of pixels, each of the plurality of pixels including a photoelectric converter, and first and second memories;
a readout circuit configured to read out, from the plurality of pixels, a first image signal generated by transferring, at least once to the first memory, signal charge generated in the photoelectric converter in one shooting cycle, and a second image signal generated by transferring, at least twice or more to the second memory, and adding up signal charge generated in the photoelectric converter in the one shooting cycle; and
a controller configured to control the readout circuit so that a readout period for reading out the first image signal is overlapped at least a part of an accumulation period of the second image signal.

* * * * *